United States Patent
Tsuji

(10) Patent No.: US 9,417,512 B2
(45) Date of Patent: Aug. 16, 2016

(54) LIGHT SOURCE DEVICE AND PROJECTION-IMAGE DISPLAY APPARATUS

(71) Applicant: Panasonic Intellectual Property Management Co., Ltd., Osaka (JP)

(72) Inventor: Kiyoko Tsuji, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/687,023

(22) Filed: Apr. 15, 2015

(65) Prior Publication Data

US 2015/0301437 A1    Oct. 22, 2015

(30) Foreign Application Priority Data

Apr. 17, 2014  (JP) .................................. 2014-085158

(51) Int. Cl.
*G03B 21/20* (2006.01)
*G03B 21/14* (2006.01)
*H05K 1/00* (2006.01)

(52) U.S. Cl.
CPC ............ *G03B 21/206* (2013.01); *G03B 21/145* (2013.01); *G03B 21/20* (2013.01); *G03B 21/2013* (2013.01); *H05K 1/00* (2013.01)

(58) Field of Classification Search
CPC .... C23C 14/12; C23C 14/243; C23C 14/246; C23C 14/564; C23C 14/568; H01L 2924/00; H01L 2924/02; H01L 29/66757; H01L 29/78621; G03B 21/145
See application file for complete search history.

(56) References Cited

U.S. PATENT DOCUMENTS

2001/0028621 A1* 10/2001 Moriyama ............... G11B 7/08 369/112.23
2006/0246633 A1* 11/2006 Arai .................. H01L 29/66757 438/149

FOREIGN PATENT DOCUMENTS

JP      2008-288228 A    11/2008

* cited by examiner

*Primary Examiner* — Sultan Chowdhury
(74) *Attorney, Agent, or Firm* — McDermott Will & Emery LLP

(57) ABSTRACT

The light source device includes a first light source, a second light source, and a substrate including a base member. A first wiring and a second wiring are disposed on the substrate. The first wiring has a connection part including connection parts such that the first light source is electrically connected in series and a connection part including connection parts such that the second light source is electrically connected in series. The base member is provided with at least one through-hole at each portion where the connection parts of the connection parts are disposed, and includes a protrusion in a vicinity of the through-hole such that the protrusion protrudes along a surface of the base member in a direction intersecting the first wiring. The second wiring includes at least one detour path in a vicinity of the protrusion, detouring around the through-hole with an insulation distance from the through-hole.

5 Claims, 18 Drawing Sheets

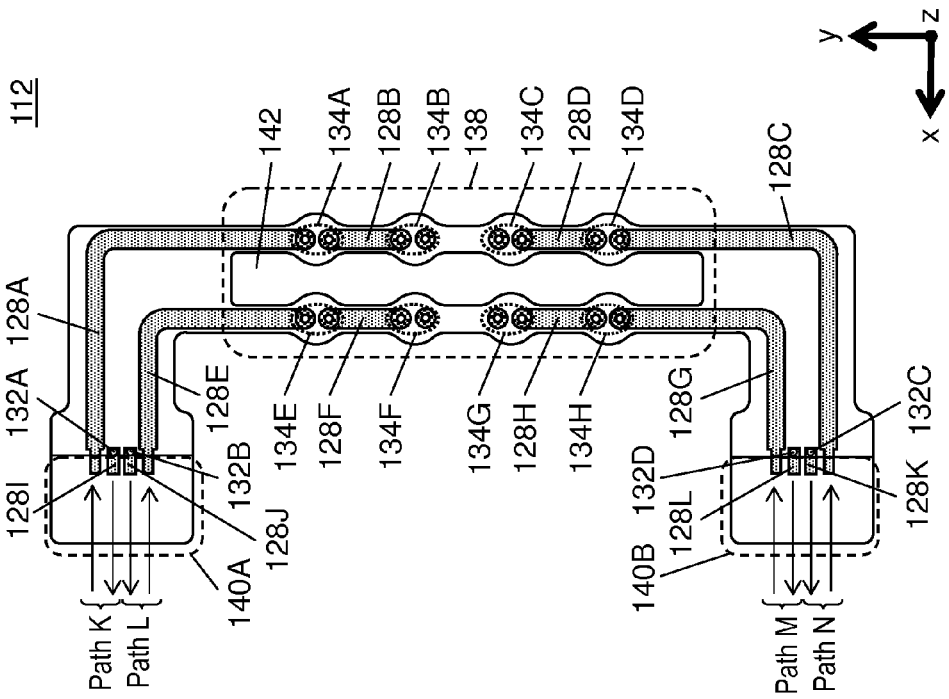
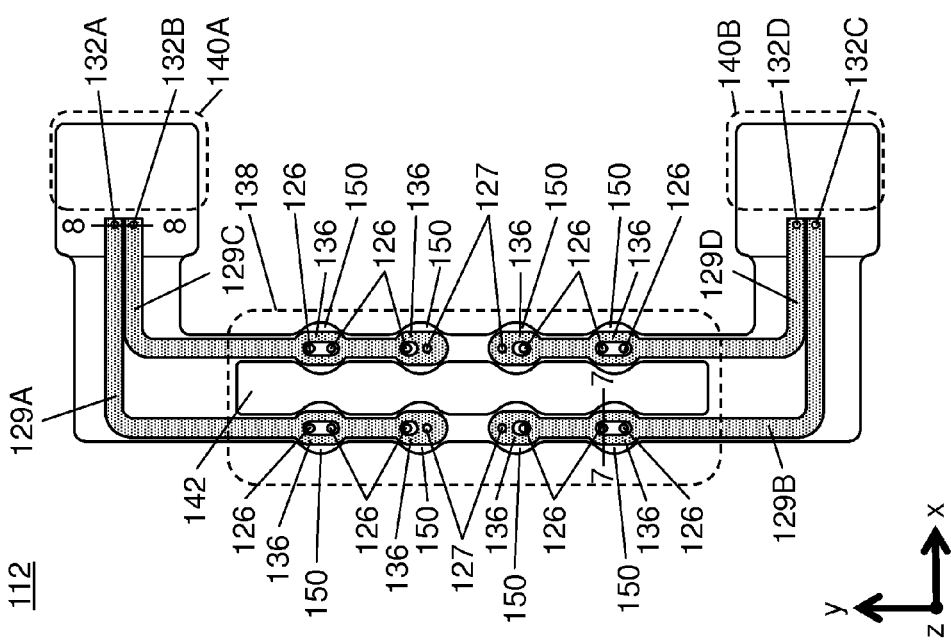

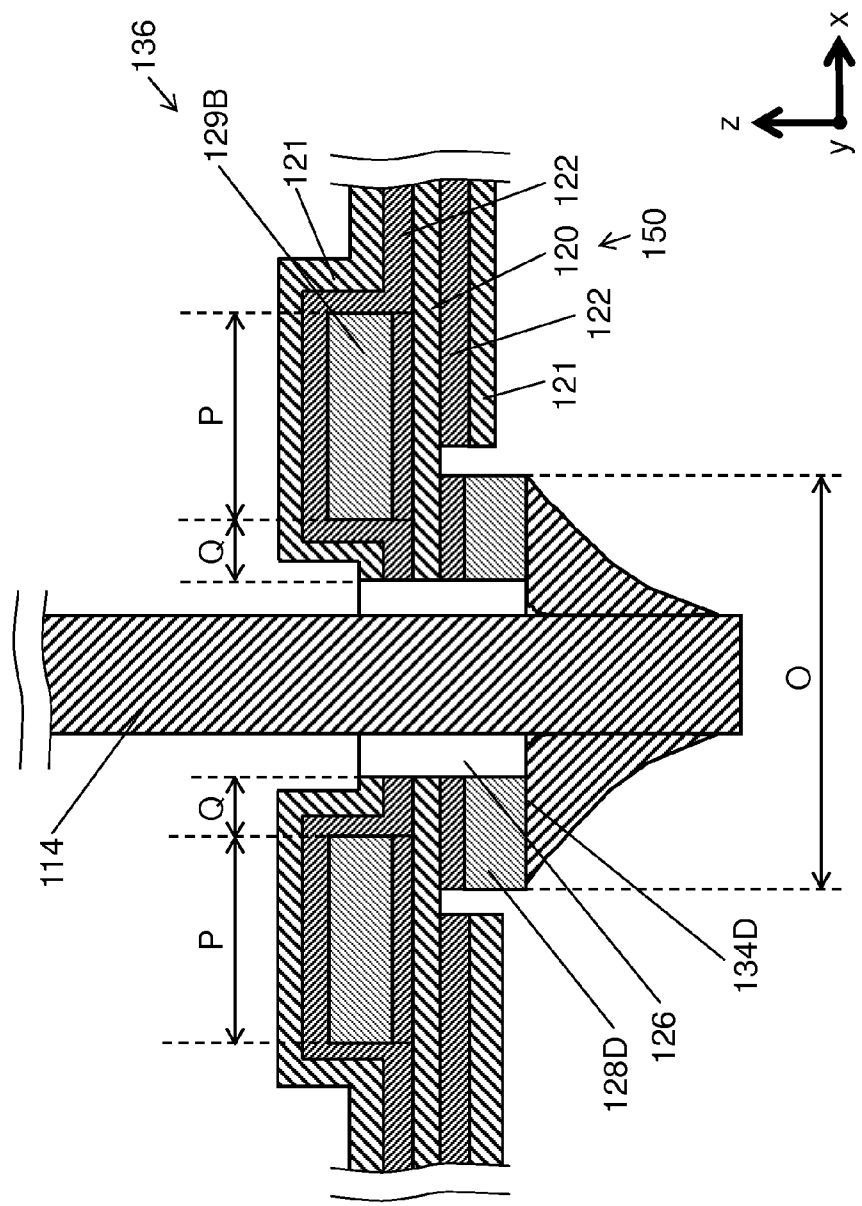

FIG. 11A
FIG. 11B
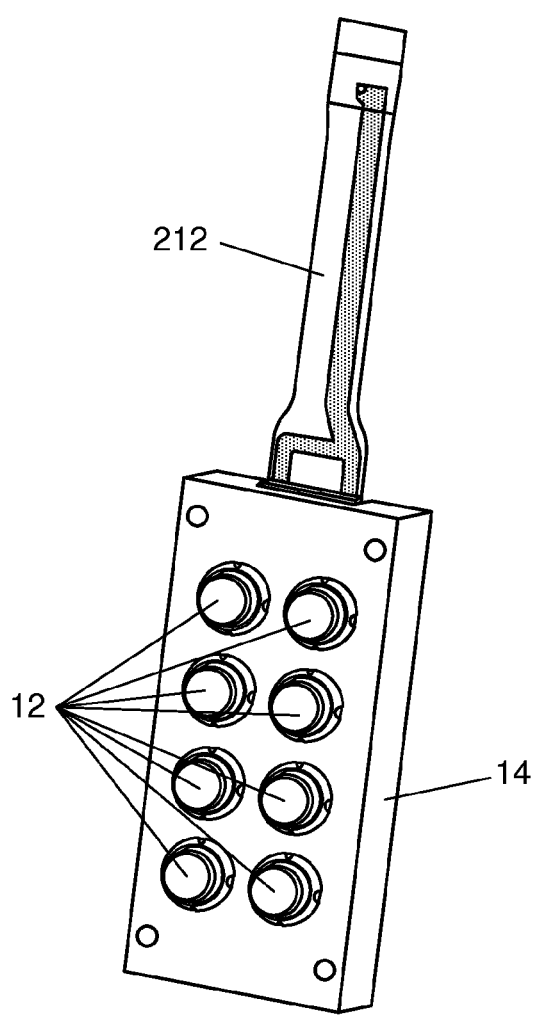
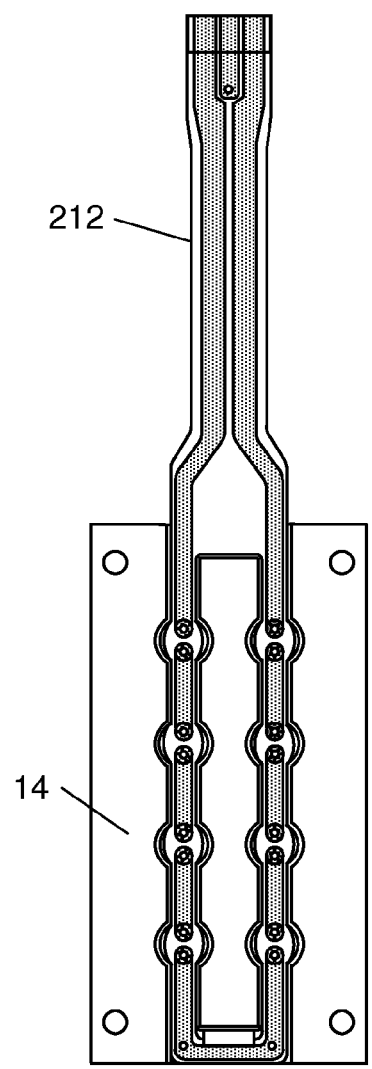

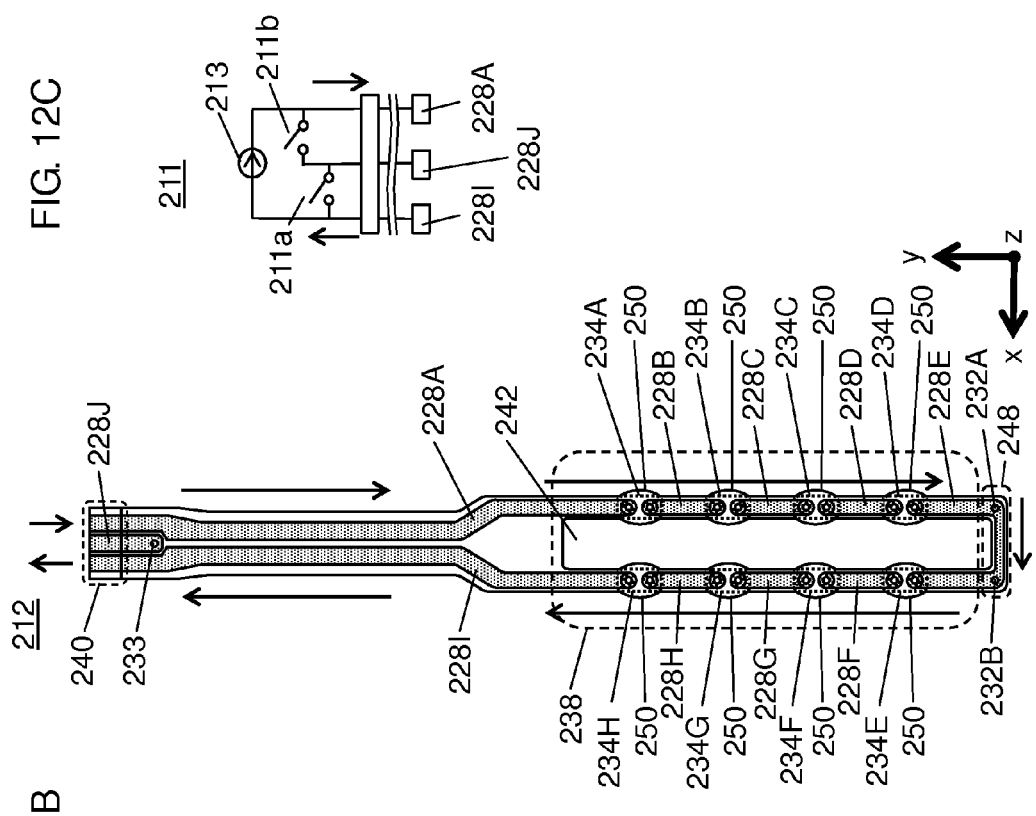

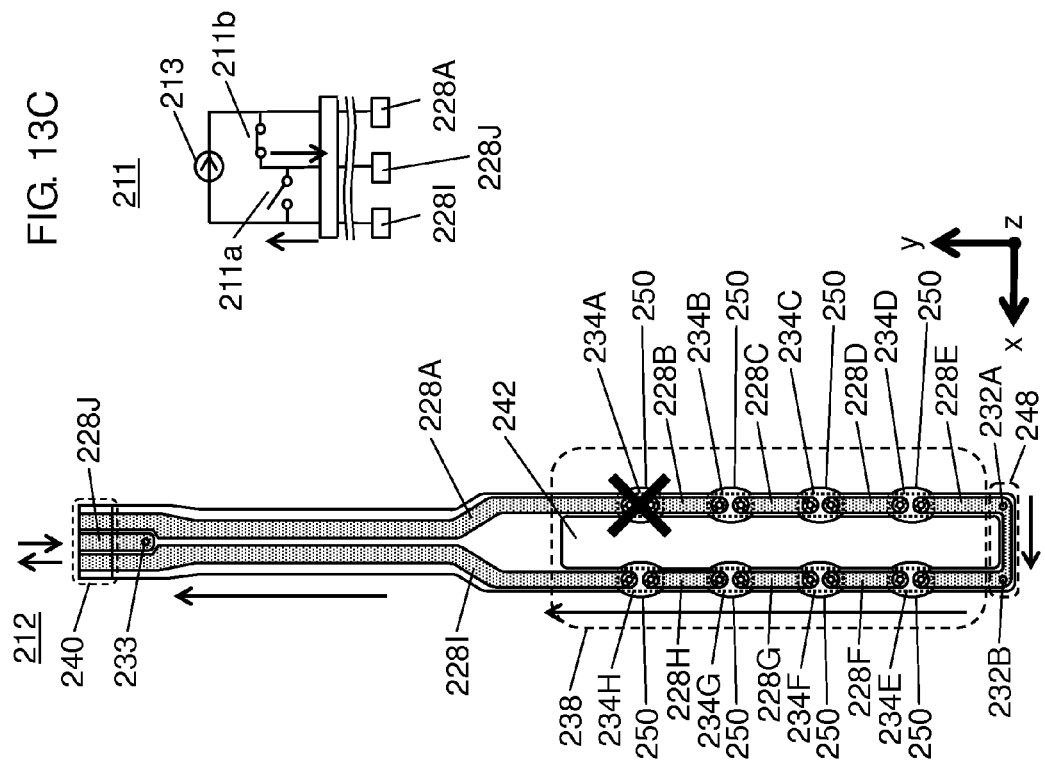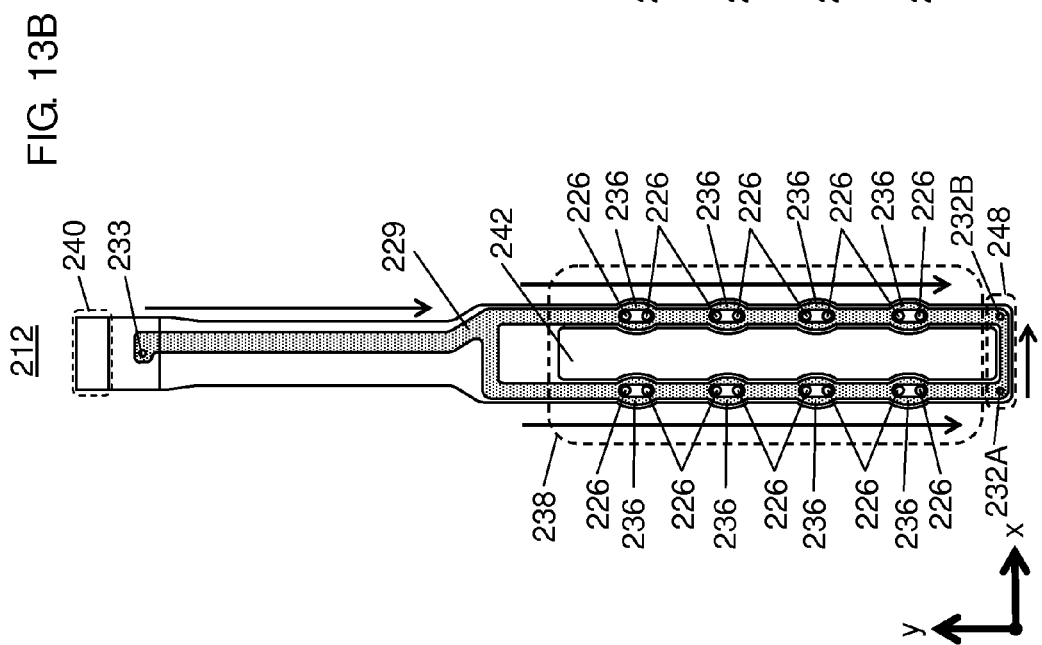

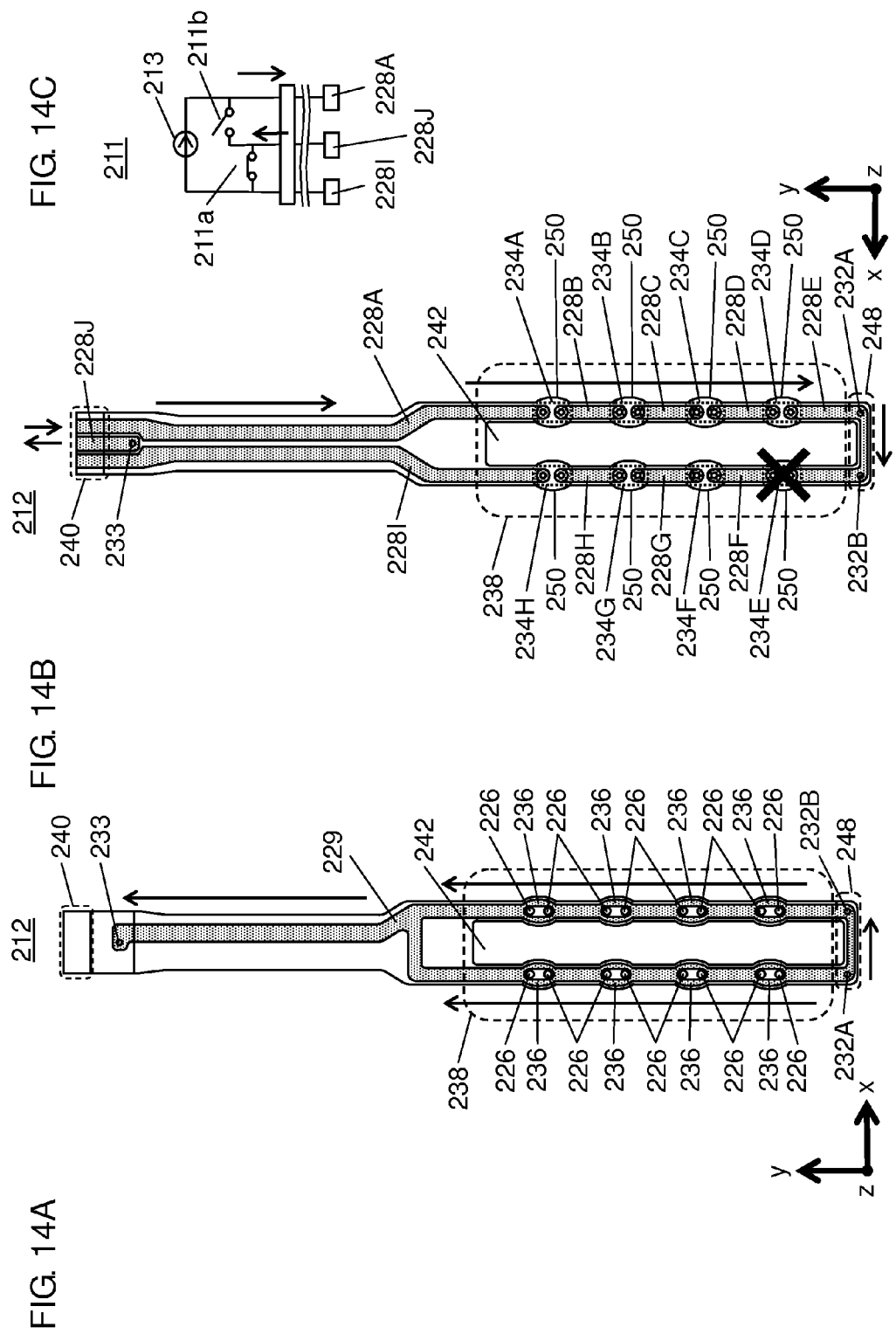

LIGHT SOURCE DEVICE AND PROJECTION-IMAGE DISPLAY APPARATUS

RELATED APPLICATIONS

This application claims the benefit of Japanese Application No. 2014-085158, filed on Apr. 17, 2014, the disclosure of which Application is incorporated by reference herein.

BACKGROUND OF THE INVENTION

1. Field of the Invention

The present disclosure relates to a light source device using a plurality of solid light sources. Further, the present disclosure relates to a projection-image display apparatus that generates image light by using light emitted from this light source device and projects the image light on a screen.

2. Description of the Related Art

Conventionally, one or more high-pressure mercury lamps of high luminance have been used as a light source in a projection-image display apparatus. However, there is a problem in that a life of the light source of those high-pressure mercury lamps is short and maintenance of those high-pressure mercury lamps becomes troublesome. Accordingly, instead of those high-pressure mercury lamps, one or more solid light sources, such as LED (Light Emitting Diode)s or laser diodes, have been used as the light source.

For example, PTL 1 discloses a small, thin, and inexpensive light source device using solid light sources that realizes uniformity in luminance and chromaticity and that has sufficient capacity for heat dissipation of the solid light sources.

CITATION LIST

Patent Literature

PTL 1: Unexamined Japanese Patent Publication No. 2008-288228

SUMMARY OF THE INVENTION

An object of the present disclosure is to provide a small light source device in consideration of a countermeasure against a failure of any semiconductor laser light sources in an open-mode, in a case where a plurality of semiconductor laser light sources is connected in series. Another object of the present disclosure is to provide a projection-image display apparatus having this light source device.

A light source device of the present disclosure includes a first light source including at least two light sources, a second light source including at least two light sources, and a substrate supplying power to the first light source and the second light source. The substrate has a multilayer structure including a base member, and a first wiring is disposed on a first layer of the substrate and a second wiring is disposed on a second layer of the substrate. The first wiring and the second wiring are electrically connected. The first wiring has a first connection part including at least two connection parts such that the first light source is electrically connected in series and a second connection part including at least two connection parts such that the second light source is electrically connected in series. The base member is provided with at least one through-hole at each portion where the connection parts of the first connection part and the second connection part are disposed. The base member includes at least one protrusion in a vicinity of the through-hole such that the protrusion protrudes along a surface of base member in a direction intersecting the first wiring. The second wiring includes at least one detour path in a vicinity of the protrusion, detouring around the through-hole with an insulation distance from the through-hole.

The present disclosure can provide the small light source device in consideration of the countermeasure against the failure of any semiconductor laser light sources in the open-mode, in a case where the plurality of semiconductor laser light sources is connected in series.

BRIEF DESCRIPTION OF DRAWINGS

FIG. 6A is a front view of a FPC according to the first exemplary embodiment;

FIG. 6B is a rear view of the FPC according to the first exemplary embodiment;

FIG. 7B is a cross-sectional view where a lead wire is inserted in FIG. 7A;

FIG. 11A is a front perspective view of a light source device according to a second exemplary embodiment in a state in which semiconductor lasers, an insulator, and an FPC are installed on a light-source holding body;

FIG. 11B is a rear view of FIG. 11A;

FIG. 12A is a front view of the FPC according to the second exemplary embodiment;

FIG. 12B is a rear view of the FPC according to the second exemplary embodiment;

FIG. 12C is a schematic diagram of a switching circuit that switches current inflow paths to the FPC according to the second exemplary embodiment;

FIG. 13A is a front view of the FPC in a case where an open-mode failure occurs in the semiconductor laser according to the second exemplary embodiment;

FIG. 13B is a rear view of the FPC in the case where the open-mode failure occurs in the semiconductor laser according to the second exemplary embodiment;

FIG. 13C is a schematic diagram of the switching circuit that switches the current inflow paths to the FPC in the case where the open-mode failure occurs in the semiconductor laser according to the second exemplary embodiment;

FIG. 14A is a front view of the FPC in a case where a second open-mode failure occurs in the semiconductor laser according to the second exemplary embodiment;

FIG. 14B is a rear view of the FPC in the case where the second open-mode failure occurs in the semiconductor laser according to the second exemplary embodiment;

FIG. 14C is a schematic diagram of the switching circuit that switches the current inflow paths to the FPC in the case where the second open-mode failure occurs in the semiconductor laser according to the second exemplary embodiment;

DETAILED DESCRIPTION OF THE PREFERRED EMBODIMENTS

Figure 1:
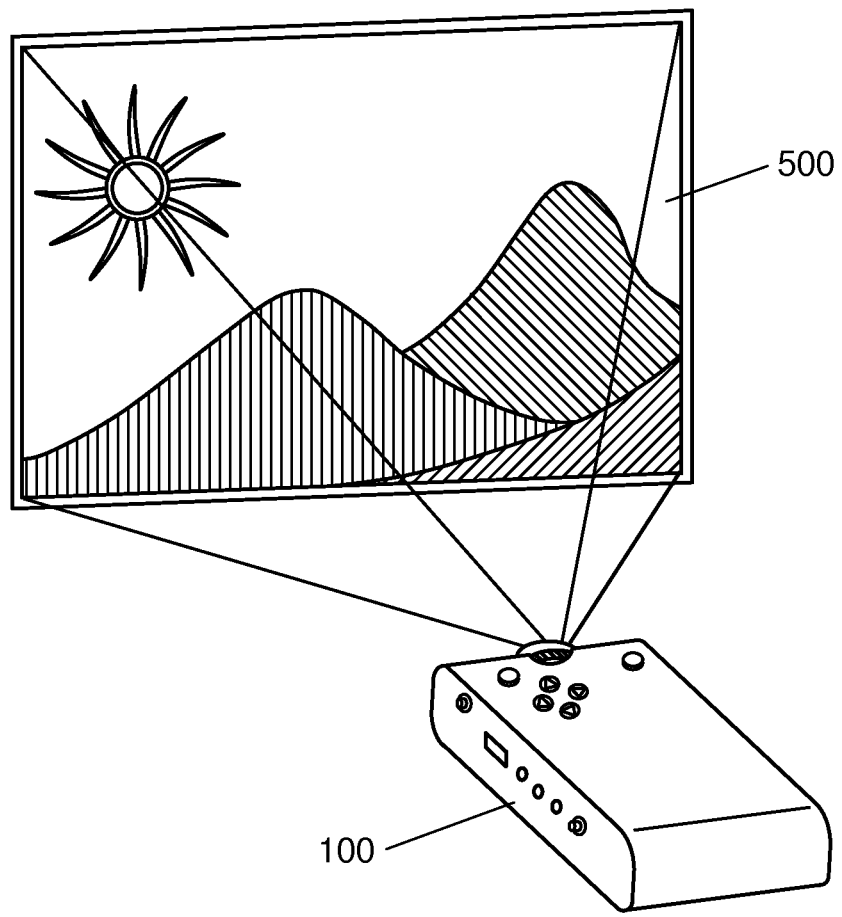
FIG. 1 is an external perspective view of a projection-image display apparatus according to the present disclosure.

Hereinafter, exemplary embodiments will be described in detail while appropriately referring to the drawings. However, unnecessarily detailed description may be omitted. For example, detailed description of a matter that has been already known well or overlapping description of substantially the same configuration may be omitted. This is to avoid unnecessary redundancy of the following description and to be easily understood by those skilled in the art.

The accompanying drawings and the following description are provided so that those skilled in the art sufficiently understand the present disclosure. It is not intended that a subject described in the claims be limited by these drawings and description.

First Exemplary Embodiment

[1-1. Configuration of Projection-Image Display Apparatus]

A configuration of a projection-image display apparatus of a first exemplary embodiment will be described. FIG. 1 is an external perspective view of the projection-image display apparatus. As illustrated in FIG. 1, projection-image display apparatus 100 projects image light generated according to image input signals onto screen 500.

Figure 2:
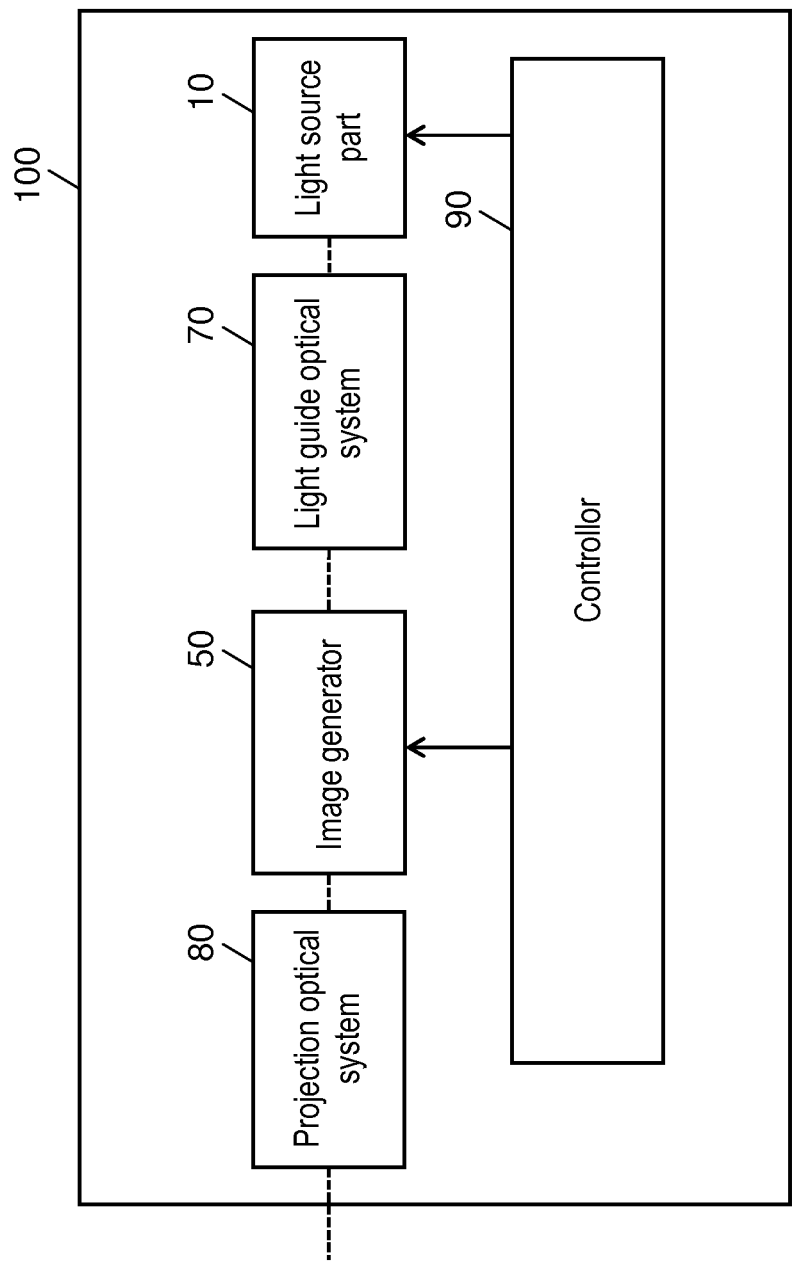
FIG. 2 is a block diagram of the projection-image display apparatus according to the present disclosure.

FIG. 2 is a block diagram of projection-image display apparatus 100. Projection-image display apparatus 100 includes light source part 10, image generator 50 for generating image light according to image input signals, light guide optical system 70 for guiding light from light source part 10 to image generator 50, projection optical system 80 for projecting the generated image light onto screen 500, and controller 90 for controlling light source part 10, image generator 50, and the like.

[1-2. Optical Configuration of Projection-Image Display Apparatus]

Figure 3:
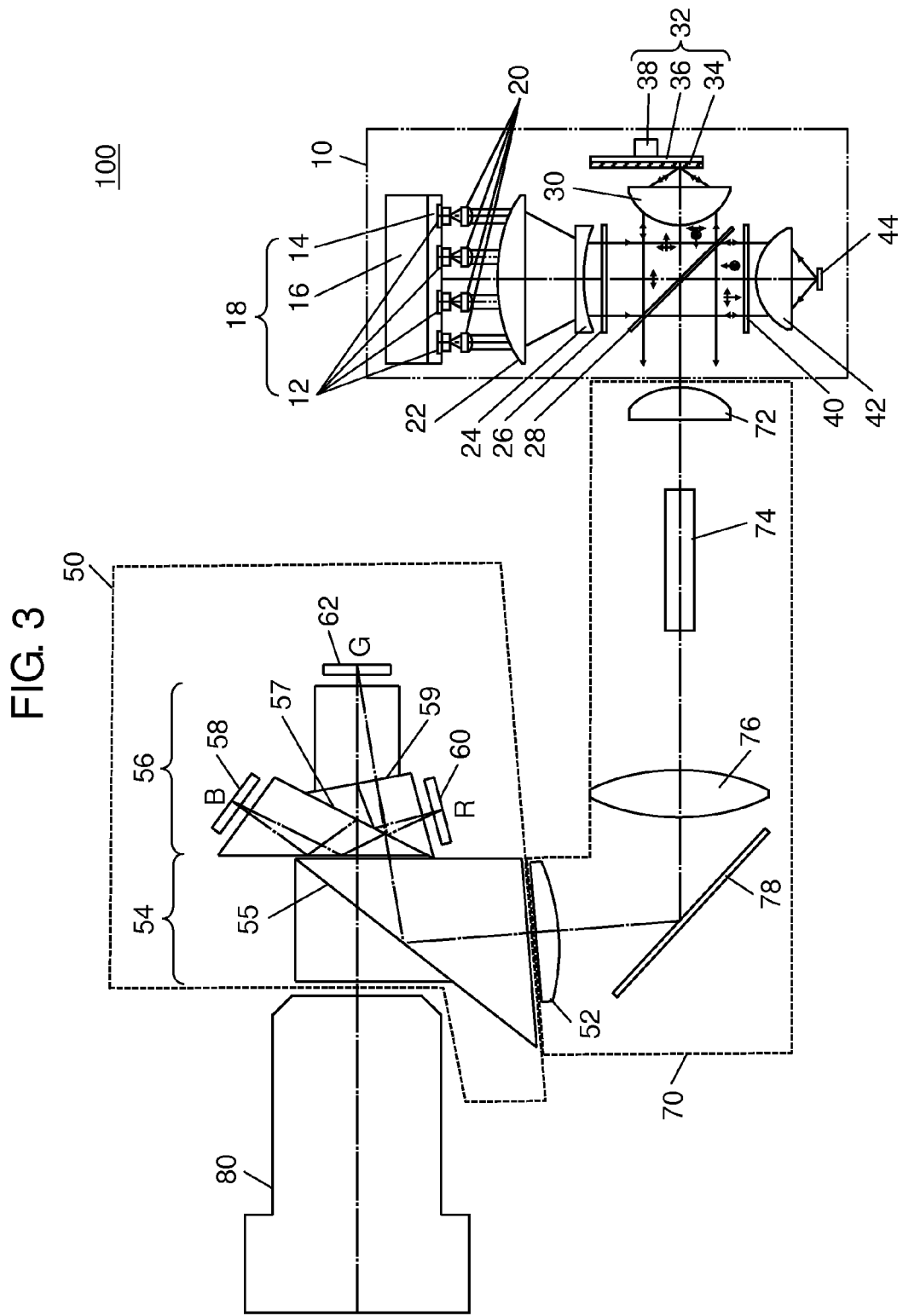
FIG. 3 is a schematic view illustrating an optical configuration of the projection-image display apparatus according to the present disclosure.

Next, an optical configuration of projection-image display apparatus 100 will be described. FIG. 3 is a schematic view illustrating the optical configuration of projection-image display apparatus 100.

Light source part 10 has light source unit 18 that includes eight blue semiconductor lasers 12, light-source holding body 14 for mounting eight blue semiconductor lasers 12, and heat sink 16 arranged on a surface of light-source holding body 14 opposite to a surface on which eight semiconductor lasers 12 are mounted. In FIG. 3, the number of illustrated semiconductor lasers 12 is four. However, light source unit 18 further has four semiconductor lasers 12 that are not illustrated. Eight semiconductor lasers 12 emit linearly polarized blue light with a wavelength from 440 nm to 455 nm inclusive. Eight semiconductor lasers 12 are disposed in such a manner that a polarization direction of light emitted from semiconductor laser 12 becomes P-polarized light with respect to an incident surface of dichroic mirror 28.

In the present exemplary embodiment, it is described that the number of semiconductor lasers 12 of light source unit 18 is eight. However, the present disclosure is not limited to this.

Lens 20 is arranged at each of eight semiconductor lasers 12. The blue light emitted from light source unit 18 is incident on eight lenses 20, and after that, is transmitted through lens 22 and lens 24 to be collimated. The blue light is transmitted through diffuser plate 26, thereby reducing coherence.

The blue light transmitted through diffuser plate 26 is incident on dichroic mirror 28. On average, dichroic mirror 28 transmits 15% and reflects 85% of P-polarized light with a wavelength from 440 nm to 455 nm inclusive. Further, dichroic mirror 28 reflects 95% or more on average of, i.e., substantially totally reflects, S-polarized light with a wavelength from 440 nm to 455 nm inclusive. Further, dichroic mirror 28 transmits 96% or more of, i.e., substantially totally transmits, both the P-polarized light and the S-polarized light with wavelengths of 500 nm or more.

Phosphor wheel 32 is irradiated, via condenser lens 30, with about 85% of the P-polarized blue light reflected on dichroic mirror 28. Phosphor wheel 32 includes aluminum disk 36 formed with phosphor layer 34 and motor 38. Phosphor layer 34 is excited by the blue light and emits mixed light of green light and red light, i.e., yellow light, with a wavelength of 500 nm or more.

The yellow light including green and red components generated by phosphor layer 34 is reflected by aluminum disk 36 in a direction of dichroic mirror 28. Condenser lens 30 condenses the blue light incident on phosphor wheel 32 and collimates the yellow light emitted from phosphor wheel 32. The yellow light transmits through dichroic mirror 28.

A diffusion reflecting plate 44 is irradiated with about 15% of the P-polarized blue light transmitted through dichroic mirror 28 via ¼ wavelength plate 40 and condenser lens 42. ¼ wavelength plate 40 converts the P-polarized blue light into circularly polarized light.

Coherence of the light incident on diffusion reflecting plate 44 is further reduced, and the light incident on diffusion reflecting plate 44 is reflected in the direction of dichroic mirror 28. Condenser lens 42 condenses the blue light incident on diffusion reflecting plate 44 and collimates the blue light emitted from diffusion reflecting plate 44. ¼ wavelength plate 40 converts the circularly polarized blue light reflected in the direction of dichroic mirror 28 into S-polarized light. The blue light converted into the S-polarized light is reflected by dichroic mirror 28.

The yellow light transmitted through dichroic mirror 28 and the blue light reflected by dichroic mirror 28 are synthesized to become white light. The white light is incident on light guide optical system 70. The white light incident on light guide optical system 70 is first incident on condensing lens 72 and is condensed in a vicinity of an incident surface of rod integrator 74.

By reflecting the white light incident on rod integrator 74 plural times inside rod integrator 74, a light intensity distribution of the white light is made uniform, thereby emitting the white light. The white light emitted from rod integrator 74 is condensed by relay lens 76. The white light emitted from relay lens 76 is reflected by mirror 78, and after that, transmits through field lens 52 and is incident on image generator 50.

The white light incident on image generator 50 is incident on total reflection prism 54.

Total reflection prism 54 includes two prisms, and a thin air layer is formed on proximity surfaces of the respective prisms. The air layer totally reflects incident light at an angle larger than or equal to a critical angle. The white light incident on total reflection prism 54 via field lens 52 is reflected by total reflection surface 55 made of the air layer and is incident on color prism 56.

Color prism 56 includes three prisms, and blue reflecting dichroic mirror surface 57 and red reflecting dichroic mirror surface 59 are formed on proximity surfaces of the respective prisms. The white light incident on color prism 56 is separated into blue light, red light, and green light by blue reflecting dichroic mirror surface 57 and red reflecting dichroic mirror surface 59.

A cutoff wavelength of red reflecting dichroic mirror surface 59 is set such that a light quantity ratio between the red light and the green light is desirable in a wavelength band of the yellow light generated at the light source part 10. The blue light is incident on DMD (Digital Mirror Device) 58, the red light is incident on DMD 60, and the green light is incident on DMD 62. Each of DMDs 58, 60, 62 changes a reflecting direction of the incident light by deflecting a micro mirror (not illustrated) according to image input signals, and modulates image light incident on projection optical system 80 and unnecessary light advancing to outside an effective region of projection optical system 80, thereby generating image light.

The generated image light again transmits through color prism 56. In the process of transmitting through color prism 56, the separated blue light, red light, and green light are synthesized and incident on total reflection prism 54. Since the light incident on total reflection prism 54 is incident on total reflection surface 55 at an angle smaller than the critical angle, the light is transmitted and incident on projection optical system 80. In this way, the image light is projected on screen 500.

Since light source part 10 includes eight blue semiconductor lasers 12 and highly efficiently emits the white light with good white balance, projection-image display apparatus 100 can have a long life and high luminance. Further, since DMDs 58, 60, 62 are used in image generator 50, projection-image display apparatus 100 can have high light resistance and heat resistance compared to a liquid crystal panel. Further, since three DMDs 58, 60, 62 are used, color reproduction is excellent, and a projected image is bright and high definition.

[1-3. Configuration of Light Source Device]

Figure 4:
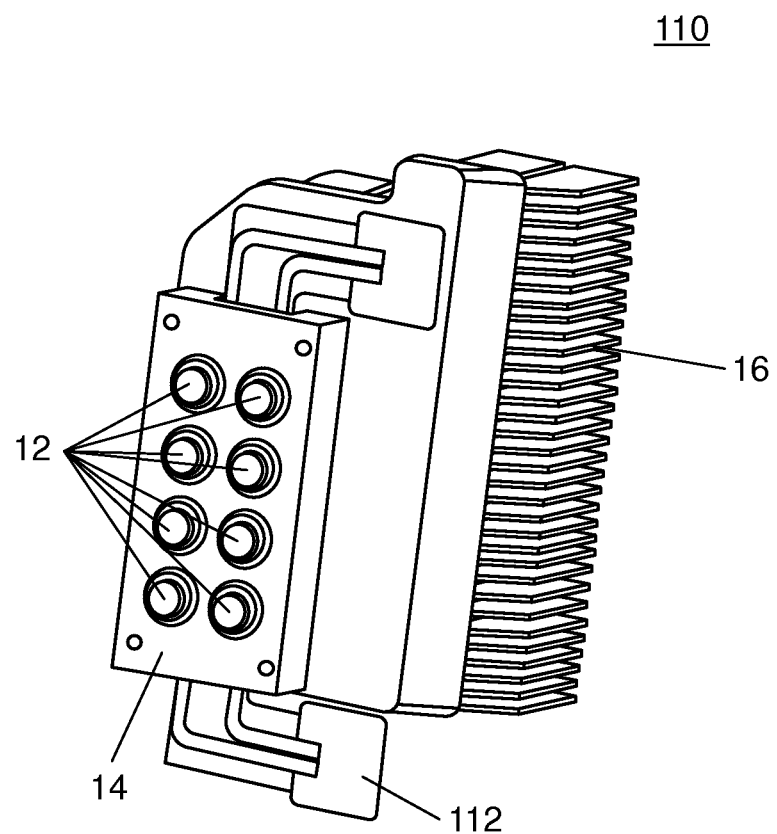
FIG. 4 is an external perspective view of a light source device according to a first exemplary embodiment.
Figure 5:
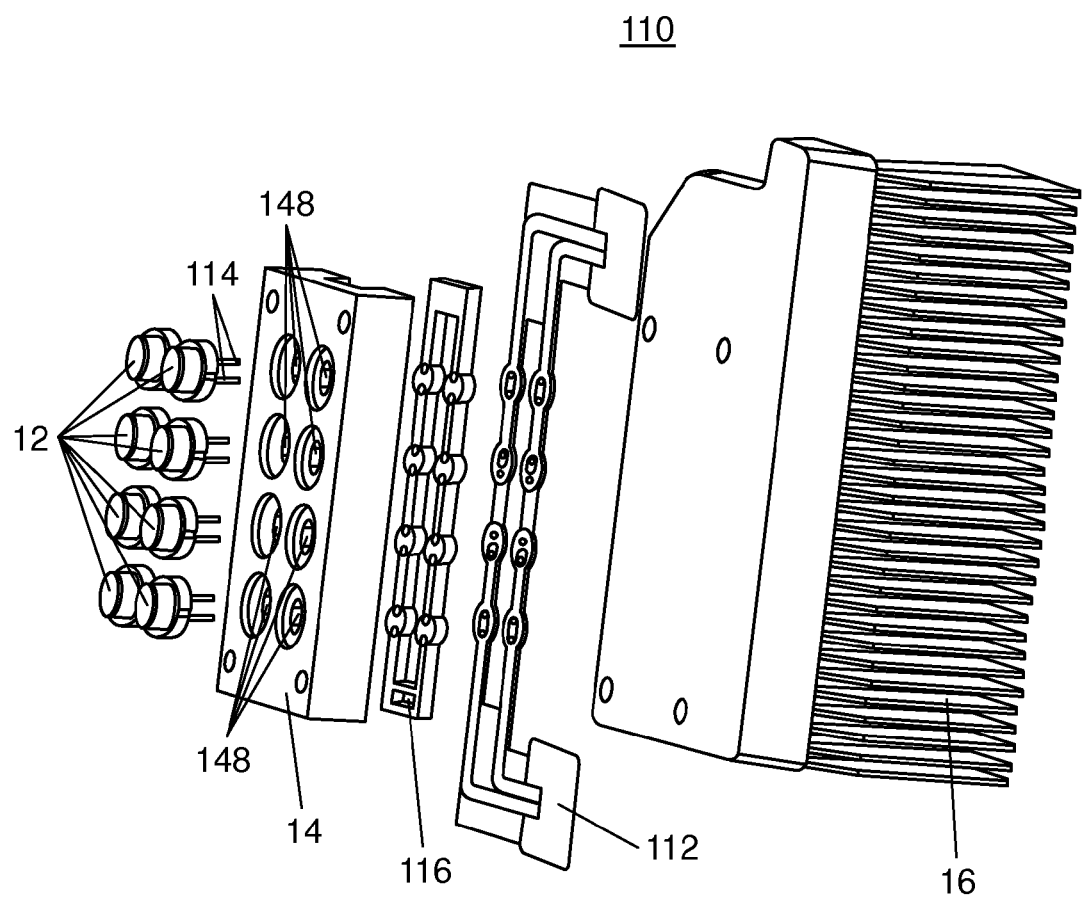
FIG. 5 is an exploded perspective view of the light source device in FIG. 4.

Next, description will be given of a configuration of a light source device including light source unit 18 that is described as the optical configuration of projection-image display apparatus 100. FIG. 4 is an external perspective view of light source device 110, and FIG. 5 is an exploded perspective view of light source device 110 in FIG. 4. Light source unit 18 of projection-image display apparatus 100 includes one or more light source devices 110.

As illustrated in FIGS. 4 and 5, light source device 110 has eight blue semiconductor lasers 12, light-source holding body 14 for mounting eight blue semiconductor lasers 12, and heat sink 16 arranged on a surface of light-source holding body 14 opposite to a surface on which eight semiconductor lasers 12 are mounted.

Further, as illustrated in FIG. 5, FPC (Flexible Printed Circuits) 112 for supplying power to eight semiconductor lasers 12 is provided between light-source holding body 14 and heat sink 16.

In the present exemplary embodiment, it is described that a substrate for supplying power is flexible as FPC 112. However, the present disclosure is not limited to this, and a hard substrate may be used.

Each semiconductor laser 12 has two lead wires 114. Insulator 116 is inserted between lead wires 114 and light-source holding body 14 for reliably insulating lead wires 114 and light-source holding body 14.

Each two of eight semiconductor lasers 12 are electrically connected in series. Two sets of those two semiconductor lasers 12, i.e., four semiconductor lasers 12, are disposed in line. Those four semiconductor lasers 12 disposed in line are disposed in two rows and are held by light-source holding body 14.

Light-source holding body 14 is provided with eight through-holes 148. Semiconductor lasers 12 are mounted on light-source holding body 14 by inserting two lead wires 114 of each semiconductor laser 12 into each through-hole 148 from a surface side of light-source holding body 14, i.e., a left side in FIG. 5. Insulator 116 is mounted on light-source holding body 14 so as to fit in light-source holding body 14 and lead wires 114 from a rear side of light-source holding body 14, i.e., a right side in FIG. 5. FPC 112 is similarly mounted on light-source holding body 14 so as to fit in light-source holding body 14 and lead wires 114 from the rear side of light-source holding body 14.

A thickness dimension of insulator 116 is designed such that lead wires 114 protrude from a rear surface of FPC 112 via insulator 116. Lead wires 114 protruded from the rear surface of FPC 112 are electrically connected with FPC 112 by solder, and power is supplied to semiconductor lasers 12 via FPC 112.

[1-4. Configuration of FPC]

Next, FPC 112 of light source device 110 will be described in detail. FIG. 6A is a front view of FPC 112, and FIG. 6B is a rear view of FPC 112. Here, it is described that a front surface of FPC 112 is a surface on which semiconductor lasers 12 are arranged and that a rear surface of FPC 112 is a surface on which heat sink 16 is arranged.

FPC 112 has a two-layer structure including conducting wires. As illustrated in FIGS. 6A and 6B, FPC 112 is U-shaped and has opening 142 in the middle. FPC 112 further has laser connection part 138 in the middle and has external connection parts 140A, 140B at each end. At laser connection part 138, each four of eight semiconductor lasers 12 are disposed in line in the y-axis direction and are arranged parallel in two rows with opening 142 in between. Conducting wires 128A, 128B, 128C, 128D, 128E, 128F, 128G, 128H, 128I, 128J, 128K, 128L, 129A, 129B, 129C, 129D form a power supply circuit for supplying power to eight semiconductor lasers 12. Parts of conducting wires 128A, 128I, 128J, 128E are arranged at external connection part 140A, and parts of conducting wires 128G, 128L, 128K, 128C are arranged at external connection part 140B.

As illustrated in FIG. 6B, laser terminals 134A, 134B, 134C, 134D and laser terminals 134E, 134F, 134G, 134H are formed at eight portions of laser connection part 138 on the rear surface of FPC 112. Laser terminals 134A, 134B, 134C, 134D and laser terminals 134E, 134F, 134G, 134H are electrically connected with lead wires 114 of eight semiconductor lasers 12 and arranged in line in the y-axis direction. The row of laser terminals 134A, 134B, 134C, 134D and the row of laser terminals 134E, 134F, 134G, 134H are arranged in parallel in the x-axis direction. Further, as illustrated in FIGS. 6A, 6B, laser terminals 134A, 134D, 134E, 134H are respectively provided with two through-holes 126, and laser terminals 134B, 134C, 134G, 134F are respectively provided with one through-hole 126 and one through-hole 127. Pair of lead wires 114 of one semiconductor laser 12 is arranged to penetrate through-hole 126 or through-hole 127 and is electrically connected to FPC 112.

Conducting wire 128B electrically connecting between laser terminal 134A and laser terminal 134B is disposed, and conducting wire 128D electrically connecting between laser terminal 134C and laser terminal 134D is disposed. Conducting wire 128F electrically connecting between laser terminal 134E and laser terminal 134F is disposed, and conducting wire 128H electrically connecting between laser terminal 134G and laser terminal 134H is disposed.

External connection parts 140A, 140B electrically connected with an external power source are provided at each end of FPC 112. External connection part 140A and laser terminal 134A are electrically connected by conducting wire 128A, and external connection part 140A and laser terminal 134E are electrically connected by conducting wire 128E. External connection part 140B and laser terminal 134D are electrically connected by conducting wire 128C, and external connection part 140B and laser terminal 134H are electrically connected by conducting wire 128G. Conducting wire is not disposed between laser terminal 134B and laser terminal 134C and between laser terminal 134F and laser terminal 134G. Laser terminal 134B and laser terminal 134C are electrically insulated, and laser terminal 134F and laser terminal 134G are electrically insulated.

As illustrated in FIG. 6A, around pairs of through-holes 126, four linearly symmetrical detour paths 136 are arranged on the front surface of FPC 112. Each detour path 136 detours at a certain distance from hole walls of through-holes 126 in positive and negative directions of the x-axis. Additionally, around pairs of through-hole 126 and through-hole 127, another four linearly symmetrical detour paths 136 are arranged on the front surface of FPC 112. Each detour path 136 detours at a certain distance from a hole wall of through-hole 126 in the positive and negative directions of the x-axis. Further, conducting wires 129A, 129B, 129C, 129D are disposed on the front surface of FPC 112. Moreover, eight protrusions 150 each protruding in a semicircular shape in the positive and negative directions of the x-axis are formed on FPC 112 in vicinities of detour paths 136.

Figure 7A:
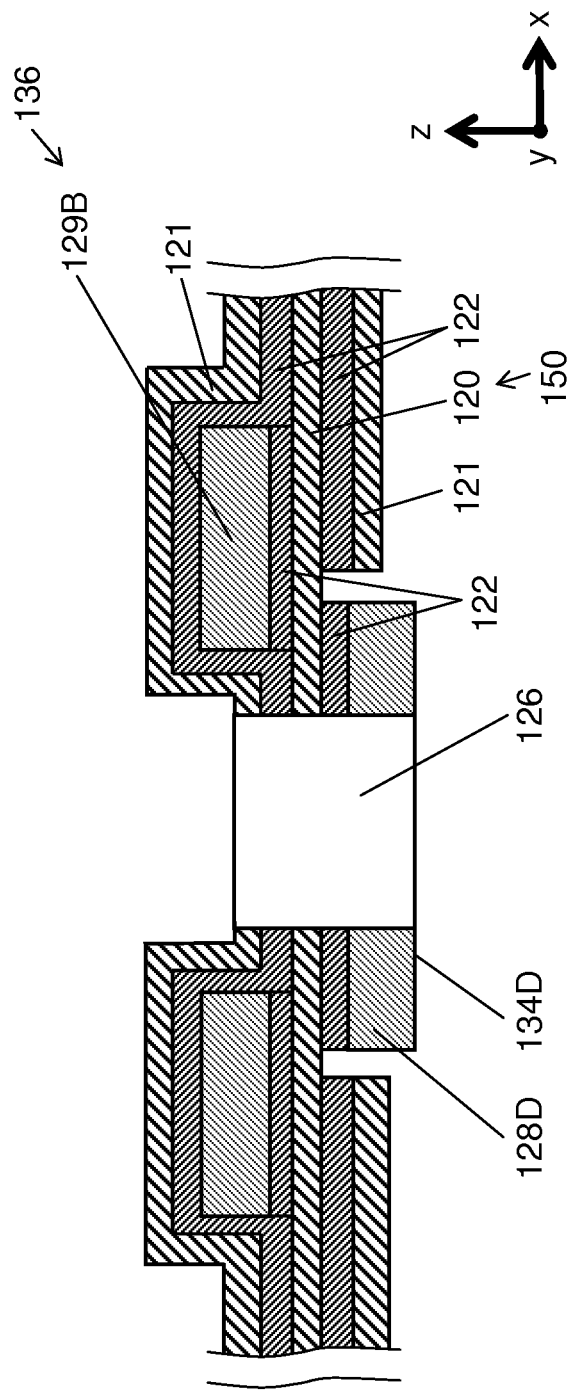
FIG. 7A is a cross-sectional view taken along a line 7-7 in FIG. 6A.

FIG. 7A is a cross-sectional view taken along a line 7-7 in FIG. 6A, and FIG. 7B is a cross-sectional view where lead wire 114 is inserted in FIG. 7A. As illustrated in FIG. 7A, conducting wires 128D, 129B are disposed on each surface of insulation film 120 serving as a base with adhesive 122 therebetween. A portion on a bottom side in FIG. 7A where conducting wire 128D is not disposed is covered with insulation protective film 121 of the same kind with adhesive 122 therebetween. Laser terminal 134D is formed on a surface of conducting wire 128D on the bottom side in FIG. 7A. An entire surface of conducting wire 129B is covered with insulation protective film 121 with adhesive 122 therebetween. Conducting wire 128D and conducting wire 129B are insulated by insulation film 120. Conducting wire 129B is formed with detour path 136. Cross-sectional structures of laser terminals 134A, 134B, 134C, 134D, 134E, 134F, 134G, 134H in FIG. 6B in vicinities of through-holes 126 are the same as the structure in FIG. 7A.

In FIG. 7B, lead wire 114 of semiconductor laser 12 protrudes from the rear surface of FPC 112 and is soldered with laser terminal 134D. Accordingly, FPC 112 and semiconductor laser 12 are electrically connected.

In order to prevent damage of the substrate due to Joule heating, a cross-sectional area of a conducting wire is set in proportion to an amount of current, using 35 µm in thickness and 1 mm in width per ampere as a standard. Therefore, if an amount of current is halved, the conducting wire cross-sectional area may be halved. An amount of current that flows in one side of linearly symmetrical detour path 136, which symmetric axis is a connecting line linking respective centers of through-holes 126, is half of an amount of current that flows in conducting wire 128D. Accordingly, conducting wire width P of detour path 136 can be set to about half of conducting wire width O of conducting wire 128D.

Further, detour path 136 is disposed at distance Q required for insulation from the hole wall of through-hole 126 so as not to be electrically conducted with lead wire 114.

Moreover, in FIGS. 6A, 6B, an end of conducting wire 129A on external connection part 140A side is electrically connected to conducting wire 128I by via hole 132A. An end of conducting wire 129C on external connection part 140A side is electrically connected to conducting wire 128J by via hole 132B. An end of conducting wire 129B on external connection part 140B side is electrically connected to conducting wire 128K by via hole 132C. An end of conducting wire 129D on external connection part 140B side is electrically connected to conducting wire 128L by via hole 132D.

Figure 8:
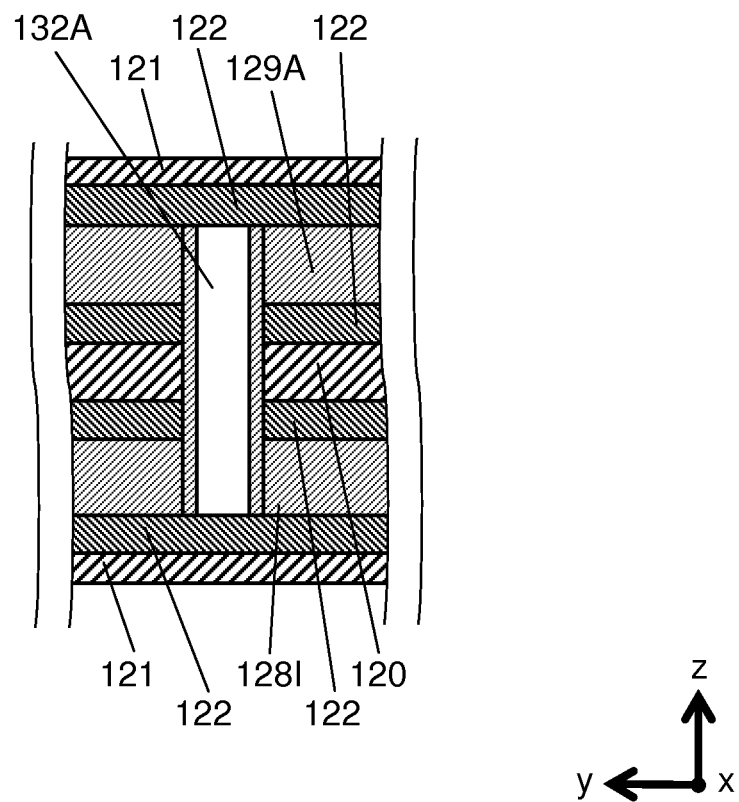
FIG. 8 is a cross-sectional view taken along a line 8-8 in FIG. 6A.

FIG. 8 is a cross-sectional view taken along a line 8-8 in FIG. 6A. FIG. 8 illustrates a cross-section of via hole 132A of conducting wire 129A. As illustrated in FIG. 8, conducting wires 129A, 128I are disposed on each surface of insulation film 120 serving as a base with adhesive 122 therebetween. The other surfaces of conducting wires 129A, 128I are covered with insulation protective film 121 of the same kind with adhesive 122 therebetween. As illustrated in FIG. 8, a current path in the z-axis direction is formed by plating a hole wall surface of via hole 132A, therefore conducting wires 129A and 128I are electrically connected. Cross-sectional structures of via holes 132B, 132C, 132D are the same as the structure of via hole 132A.

Further, in FIGS. 6A, 6B, in the same way as via hole 132A, a hole wall of through-hole 127 is plated and a current path in the z-axis direction is formed. Therefore, when each pair of lead wires 114 of semiconductor laser 12 is penetrated through through-hole 127 and is soldered, conducting wire 129A and conducting wire 128B are electrically connected via laser terminal 134B, conducting wire 129B and conducting wire 128D are electrically connected via laser terminal 134C, conducting wire 129C and conducting wire 128F are electrically connected via laser terminal 134F, and conducting wire 129D and conducting wire 128H are electrically connected via laser terminal 134G.

Moreover, at laser connection part 138, conducting wires 128A and 128B are disposed at a position overlapping with conducting wire 129A as viewed in the z-axis direction. Similarly, at laser connection 138, conducting wires 128C and 128D are disposed at a position overlapping with conducting wire 129B, conducting wires 128E and 128F are disposed at a position overlapping with conducting wire 129C, and conducting wires 128G and 128H are disposed at a position overlapping with conducting wire 129D as viewed in the z-axis direction.

[1-5. Light-Emitting Operation of Semiconductor Lasers]

Next, light emitting operation of semiconductor lasers 12 will be described. A current flows into external connection parts 140A, 140B from the external power source. Paths K, L, M, N are current paths.

In path K, the current flows into conducting wire 128A, and flows, via conducting wire 128B, in two semiconductor lasers 12 electrically connected to laser terminal 134A and laser terminal 134B. After that, the current flows to conducting wire 129A via through-hole 127, detours through-holes 126 via detour paths 136, and flows to the end of conducting wire 129A on external connection part 140A side. The current flows to conducting wire 128I via via hole 132A, and returns to the external power source from external connection part 140A. Due to this path, light is emitted by two semiconductor lasers 12 electrically connected to laser terminals 134A and 134B.

The current flows into conducting wire 128C in path N, and flows, via conducting wire 128D, in two semiconductor lasers 12 electrically connected to laser terminal 134D and laser terminal 134C. After that, the current flows to conducting wire 129B via through-hole 127, detours through-holes 126 via detour paths 136, and flows to the end of conducting wire 129B on external connection part 140B side. The current flows to conducting wire 128K via via hole 132C, and returns to the external power source from external connection part 140B. Due to this path, light is emitted by two semiconductor lasers 12 electrically connected to laser terminals 134C and 134D.

The current flows into conducting wire 128E in path L, and flows, via conducting wire 128F, in two semiconductor lasers 12 electrically connected to laser terminal 134E and laser terminal 134F. After that, the current flows to conducting wire 129C via through-hole 127, detours through-holes 126 via detour paths 136, and flows to the end of conducting wire 129C on external connection part 140A side. The current flows to conducting wire 128J via via hole 132B, and returns to the external power source from external connection part 140A. Due to this path, light is emitted by two semiconductor lasers 12 electrically connected to laser terminals 134E and 134F.

The current flows into conducting wire 128G in path M, and flows, via conducting wire 128H, in two semiconductor lasers 12 electrically connected to laser terminal 134H and laser terminal 134G. After that, the current flows to conducting wire 129D via through-hole 127, detours through-holes 126 via detour paths 136, and flows to the end of conducting wire 129D on external connection part 140B side. The current flows to conducting wire 128L via via hole 132D, and returns to the external power source from external connection part 140B. Due to this path, light is emitted by two semiconductor lasers 12 electrically connected to laser terminals 134G and 134H.

[1-6. Configuration of Light-Source Holding Body]

Figure 9A:
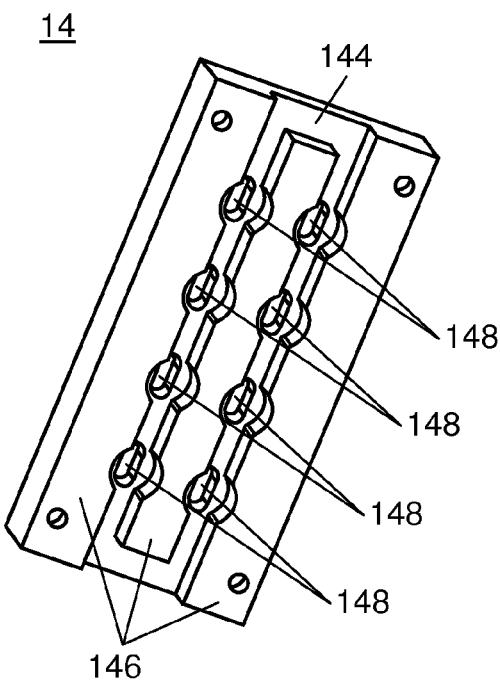
FIG. 9A is a rear perspective view of a light-source holding body according to the first exemplary embodiment.
Figure 9B:
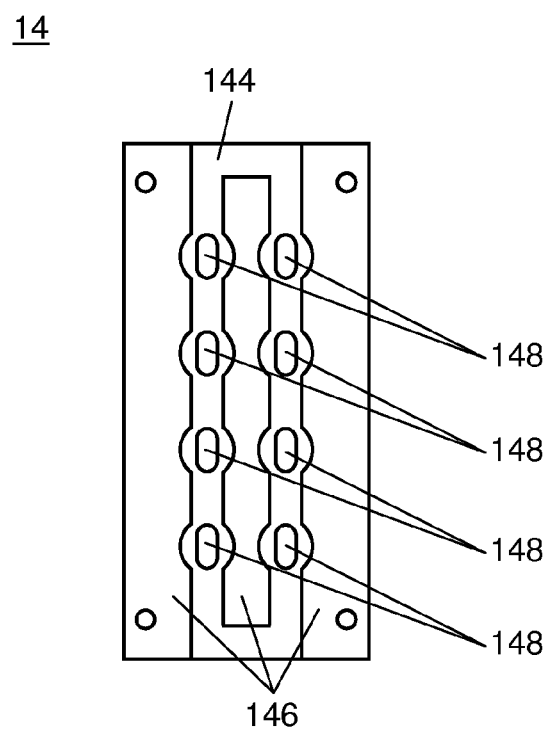
FIG. 9B is a rear view of the light-source holding body according to the first exemplary embodiment.

Next, light-source holding body 14 will be described in detail. FIG. 9A is a rear perspective view of light-source holding body 14, and FIG. 9B is a rear view of light-source holding body 14. Here, it is described that a rear surface of light-source holding body 14 is a surface on which FPC 112 is arranged.

In order to easily transmit heat generated by semiconductor laser 12 to heat sink 16, light-source holding body 14 is composed of a metal having good thermal conductivity, such as aluminum or copper. As illustrated in FIGS. 9A, 9B, recess 144 that receives insulator 116 and FPC 112 and convex portion 146 that is in contact with heat sink 16 are formed on the rear surface of light-source holding body 14.

Figure 10A:
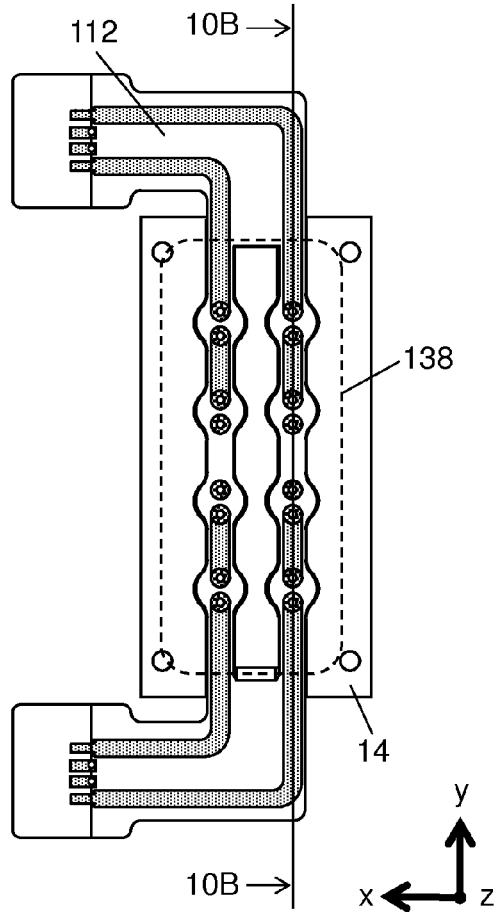
FIG. 10A is a rear view of the light-source holding body with semiconductor lasers, an insulator, and the FPC of the light source device according to the first exemplary embodiment installed.
Figure 10B:
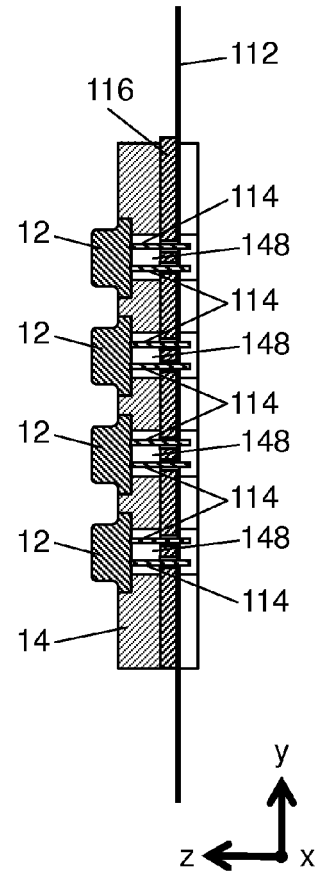
FIG. 10B is a cross-sectional view taken along a line 10B-10B in FIG. 10A.
Figure 10C:
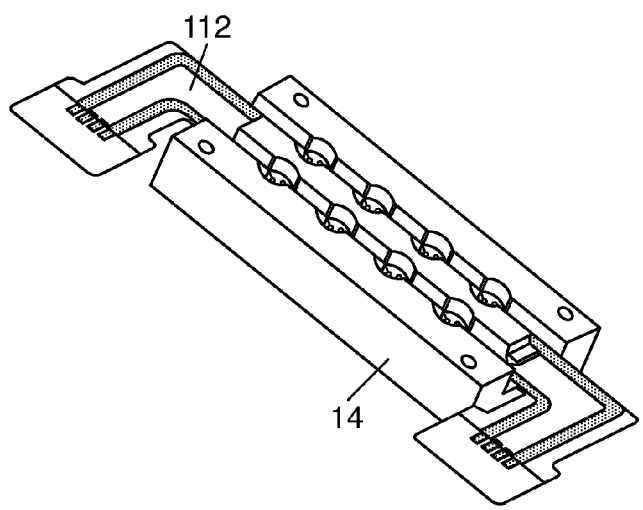
FIG. 10C is a rear perspective view of FIG. 10A.

FIG. 10A is a rear view of light-source holding body 14, semiconductor lasers 12, insulator 116, FPC 112 of light source device 110. FIG. 10B is a cross-sectional view taken along a line 10B-10B in FIG. 10A, and FIG. 10C is a perspective view of FIG. 10A.

Laser connection part 138 of FPC 112 is received in recess 144 of light-source holding body 14. In order to increase a contact area between light-source holding body 14 and heat sink 16 as much as possible, a shape of recess 144 is substantially similar to an outer shape of laser connection part 138 of FPC 112 to be received. Accordingly, a circular recess is provided around each of eight through-holes 148 so as to receive protrusion 150 of FPC 112. A depth of recess 144 of light-source holding body 14, which is a height of convex portion 146, is set so as to keep an insulation distance between a tip of lead wire 114 of semiconductor laser 12 and heat sink 16.

[1-7. Effects Etc.]

As mentioned above, in FPC 112, conducting wires 128A and 128B are disposed at the position overlapping with conducting wire 129A as viewed in the z-axis direction. Similarly, conducting wires 128C and 128D are disposed at the position overlapping with conducting wire 129B, conducting wires 128E and 128F are disposed at the position overlapping with conducting wire 129C, and conducting wires 128G and 128H are disposed at the position overlapping with conducting wire 129D as viewed in the z-axis direction. Accordingly, a width of recess 144 of light-source holding body 14 can be narrowed and the contact area between heat sink 16 and light-source holding body 14 can be increased. Therefore the light source device is advantageous to cooling.

Further, in a case where the plurality of semiconductor lasers is connected in series and used as a light source, when any semiconductor laser fails in an open-mode, not only the failed semiconductor laser, but also the other semiconductor lasers connected in series cannot emit light and the light source is turned off. As a countermeasure against the failure, applying a parallel connection or providing a failure countermeasure circuit may be employed. However, the number of wiring patterns is increased in such cases. Even if an appropriate wiring pattern is provided at each solid light source for an open-mode failure, as described in PTL 1, the added wiring patterns are needed to be arranged with an insulation distance. Accordingly, there is a problem of increasing a size of the substrate.

In the present exemplary embodiment, FPC 112 has four series circuits electrically connected each other in parallel: a first includes laser terminals 134A, 134B; a second includes laser terminals 134C, 134D; a third includes laser terminals 134E, 134F; and a fourth includes laser terminals 134G, 134H. Accordingly, even when the open-mode failure occurs in any of semiconductor lasers 12 electrically connected to laser terminals 134A, 134B, 134C, 134D, 134E, 134F, 134G, 134H, the current can continue to flow in the series circuits where the failure does not occur. Accordingly, the number of semiconductor lasers 12 to be turned off can be limited to two.

Therefore, the present exemplary embodiment can provide the small light source device in consideration of the countermeasure against the open-mode failure of any semiconductor laser light source, in a case where the plurality of semiconductor laser light sources is connected in series.

Further, as mentioned above, there is a space for receiving protrusion 150 of FPC 112 in recess 144 of light source holding body 14. By setting a diameter of this space to about 6 mm, contact between a tool, such as a soldering iron, and light-source holding body 14 can be prevented in soldering process.

Second Exemplary Embodiment

Next, a projection-image display apparatus according to a second exemplary embodiment will be described. The projection-image display apparatus in the present exemplary embodiment has the same configuration as the projection-image display apparatus described in the first exemplary embodiment, and a configuration of a light source device is different. In the present exemplary embodiment, differences in the configuration of the light source device from the first exemplary embodiment will be mainly described.

[2-1. Configuration of Light Source Device]

Since an insulator, a light-source holding body, and a heat sink in the light source device of the present exemplary embodiment have the same configuration as those in the light source device described in the first exemplary embodiment, description of the insulator, the light-source holding body, and the heat sink in the light source device is omitted.

FIG. 11A is a front perspective view of the light source device according to the present exemplary embodiment in a state in which semiconductor lasers, the insulator, and an FPC are installed on the light source holding body. FIG. 11B is a rear view of FIG. 11A.

In FIGS. 11A, 11B, eight semiconductor lasers 12, insulator 116, and FPC 212 are installed on light-source holding body 14.

[2-2. Configuration of FPC]

Next, details of FPC 212 will be described. FIG. 12A is a front view of FPC 212 in the present exemplary embodiment. FIG. 12B is a rear view of FPC 212 in the present exemplary embodiment. FIG. 12C is a schematic diagram of a switching circuit that switches current inflow paths to FPC 212 according to the present exemplary embodiment.

FPC 212 has a two-layer structure including conducting wires. In FIGS. 12A, 12B, FPC 212 has laser connection part 238 connected with the eight semiconductor lasers 12, an external connection part 240, conducting wires 228A, 228B, 228C, 228D, 228E, 228F, 228G, 228H, 228I, 228J on a rear surface, and conducting wire 229 on a front surface. FPC 212 has opening 242 in the middle. At laser connection part 238, each four of eight semiconductor lasers 12 are disposed in line in a y-axis direction and are arranged parallel in two rows with opening 242 in between.

External connection part 240 is provided for connecting laser connection part 238 to an external power supply source, and parts of conducting wires 228A, 228I, 228J are arranged at external connection part 240.

As illustrated in FIGS. 12A, 12B, on the rear surface of FPC 212, laser terminals 234A, 234B, 234C, 234D and laser terminals 234E, 234F, 234G, 234H configuring laser connection part 238 are respectively formed in a row. Laser terminals 234A, 234B, 234C, 234D, 234E, 234F, 234G, 234H are respectively provided with two through-holes 226. A pair of lead wires 114 of one semiconductor laser 12 is arranged to penetrate through two through-holes 226 and electrically connected with FPC 212.

Conducting wire 228B electrically connecting between laser terminal 234A and laser terminal 234B is disposed, conducting wire 228C electrically connecting between laser terminal 234B and laser terminal 234C is disposed, conducting wire 228D electrically connecting between laser terminal 234C and laser terminal 234D is disposed, and conducting wire 228E electrically connecting between laser terminal 234D and laser terminal 234E is disposed. Conducting wire 228F electrically connecting between laser terminal 234E and laser terminal 234F is disposed, conducting wire 228G electrically connecting between laser terminal 234F and laser terminal 234G is disposed, and conducting wire 228H electrically connecting between laser terminal 234G and laser terminal 234H is disposed.

Bridge 248 is a part orthogonal to the respective conducting wires arranged at laser connection part 238. Conducting wire 228E and conducting wire 229 are electrically connected by via holes 232A, 232B provided at bridge 248.

Conducting wires 228A, 228B, 228C, 228D, 228E, 228F, 228G, 228H, 228I, 228J, 229 form a power supply circuit for supplying power to eight semiconductor lasers 12.

As illustrated in FIG. 12A, on the front surface of FPC 212, conducting wire 229 including eight linearly symmetrical detour paths 236 are disposed. Each detour path 236 detours at a certain distance from hole walls of through-holes 226 in positive and negative directions of an x-axis. Further, as illustrated in FIG. 12B, eight protrusions 250 each protruding elliptically in positive and negative directions of the x-axis are formed in vicinities of detour paths 236.

At laser connection part 238, conducting wire 229 is disposed at a position overlapping with conducting wires 228A, 228B, 228C, 228D, 228E, 228F, 228G, 228H, 228I, excluding detour paths 236, as viewed in a z-axis direction.

Conducting wire 229 is electrically connected with conducting wire 228J in the z-axis direction by via hole 233.

Further, a switching circuit is provided outside the light source device. In FIG. 12C, switching circuit 211 includes switches 211a, 211b and current source 213. Switching circuit 211 controls current paths to conducting wires 228A, 228J, 228I.

[2-3. Light-Emitting Operation of Semiconductor Lasers]

Next, light-emitting operation of semiconductor lasers 12 will be described. As illustrated in FIG. 12C, switch 211a and switch 211b of switching circuit 211 are both turned off, and a current is set so as to flow into conducting wire 228A and flow out from conducting wire 228I.

The current flows into conducting wire 228A, and flows, via conducting wires 228B, 228C, 228D, in four semiconductor lasers 12 that are electrically connected to laser terminals 234A, 234B, 234C, 234D at laser connection part 238 on the rear surface of FPC 212. After that, the current flows in conducting wire 228E, then flows, via conducting wires 228F, 228G, 228H, in four semiconductor lasers 12 that are electrically connected to laser terminals 234E, 234F, 234G, 234H at laser connection part 238, and flows out from conducting wire 228I.

Further, by via holes 232A, 232B provided at bridge 248, when the current passes through conducting wire 228E, the current also flows to conducting wire 229 on the front surface of FPC 212 only between via hole 232A and via hole 232B.

Next, the current paths in a case where an open-mode failure occurs in one of eight semiconductor lasers 12 will be described. FIG. 13A is a front view of the FPC in a case where the open-mode failure occurs in the semiconductor laser in the present exemplary embodiment. FIG. 13B is a rear view of the FPC in the case where the open-mode failure occurs in the semiconductor laser in the present exemplary embodiment. FIG. 13C is a schematic diagram of the switching circuit that switches the current inflow paths to the FPC in the case where the open-mode failure occurs in the semiconductor laser in the present exemplary embodiment.

As illustrated in FIG. 13B, semiconductor laser 12 electrically connected to laser terminal 234A at laser connection part 238 on the rear surface of FPC 212 fails in the open-mode. In this case, as illustrated in FIG. 13C, switch 211a is turned off and switch 211b is turned on, in switching circuit 211. The current is set so as to flow in conducting wire 228J and flow out from conducting wire 228I. As illustrated in FIGS. 13A, 13B, the current flowing in from conducting wire 228J passes via hole 233, and flows to the front surface of FPC 212. The current flows in conducting wire 229 including eight detour paths 236 in a negative direction of the y-axis. After that, the current passes via holes 232A, 232B of bridge 248, and flows to conducting wire 228E on the rear surface of FPC 212.

The current flows to conducting wire 228E, and flows in semiconductor lasers 12 electrically connected to laser terminals 234E, 234F, 234G, 234H arranged at laser connection part 238 on the rear surface of FPC 212. After that, the current flows to the outside of the light source device from conducting wire 228I. Similar current paths are also formed in a case where an open-mode failure occurs in any one of semiconductor lasers 12 electrically connected to laser terminals 234B, 234C, 234D at laser connection part 238 on the rear surface of FPC 212.

FIG. 14A is a front view of the FPC in a case where a second open-mode failure occurs in the semiconductor laser in the present exemplary embodiment. FIG. 14B is a rear view of the FPC in the case where the second open-mode failure occurs in the semiconductor laser in the present exemplary embodiment. FIG. 14C is a schematic diagram of the switching circuit that switches the current inflow paths to the FPC in the case where the second open-mode failure occurs in the semiconductor laser in the present exemplary embodiment.

As illustrated in FIG. 14B, semiconductor laser 12 electrically connected to laser terminal 234E at laser connection part 238 on the rear surface of FPC 212 fails in the open-mode. In this case, as illustrated in FIG. 14C, switch 211$a$ is turned on and switch 211$b$ is turned off in switching circuit 211. On the rear surface of FPC 212, the current is set so as to flow into conducting wire 228A and flow out from conducting wire 228J. As illustrated in FIGS. 14A, 14B, the current flows into conducting wire 228A, and flows in four semiconductor lasers 12 electrically connected to laser terminals 234A, 234B, 234C, 234D disposed at laser connection part 238 on the rear surface of FPC 212. After that, the current passes via holes 232A, 232B of bridge 248, and flows to the front surface of FPC 212. The current flows in conducting wire 229 including eight detour paths 236 in a positive direction of the y-axis. Then, the current passes via hole 233, and flows from conducting wire 228J on the rear surface of FPC 212 to the outside of the light source device. Similar current paths are also formed in a case where an open-mode failure occurs in any one of semiconductor lasers 12 electrically connected to laser terminals 234F, 234G, 234H at laser connection part 238 on the rear surface of FPC 212.

Since conducting wire 229 has line-symmetric shape at laser connection part 238, electric resistance in each conducting wire of conducting wire 229 at such part is equal. Therefore, in a case where semiconductor laser 12 fails in the open-mode, about the same amount of current, i.e., a half of an amount of current flowing at laser connection part 238 on the rear surface of FPC 212, flows in each conducting wire of conducting wire 229 arranged at laser connection part 238 on the front surface of FPC 212.

Further, since linearly symmetrical conducting wire paths, which axis of symmetry is a line connecting respective centers of through-holes 226, are provided in detour path 236 as well, each amount of current flowing in the respective conducting wires arranged in one detour path 236 become the same. Consequently, an amount of current flowing in one conducting wire in one detour path 236 becomes a half of the amount of current flowing in one conducting wire of conducting wire 229 arranged at laser connection part 238 on the front surface of FPC 212, i.e., a quarter of the amount of current at laser connection part 238 on the rear surface of FPC 212. Accordingly, each conducting wire width dimension of detour path 236 can be set to about a quarter of each conducting wire width dimension of laser connection part 238 on the rear surface of FPC 212.

Further, since the amount of current flowing in one conducting wire of conducting wires 229 arranged at laser connection part 238 on the front surface of FPC 212 becomes a half of the amount of current flowing at laser connection part 238 on the rear surface of FPC 212, each width dimension of conducting wires in conducting wire 229 excluding detour paths 236 can be set to a half of the conducting wire width on the rear surface of FPC 212. However, in the present exemplary embodiment, the conducting wires on the front surface of FPC 212 and those on the rear surface of FPC 212 at laser connection part 238 are set to have the same width dimension. This is to enlarge a conducting wire cross-sectional area of conducting wire 229 and to suppress Joule heating.

In a case where any one of semiconductor lasers 12 electrically connected to laser terminals 234A, 234B, 234C, 234D at laser connection part 238 fails in the open-mode and any one of semiconductor lasers 12 electrically connected to laser terminals 234E, 234F, 234G, 234H at laser connection part 238 fails in the open-mode, no current flows to FPC 212.

[2-4. Effects Etc.]

As described above, in FPC 212, one external connection part can form a countermeasure circuit against the open-mode failure of at least one of four semiconductor lasers 12 electrically connected to laser terminals 234A, 234B, 234C, 234D or the open-mode failure of at least one of four semiconductor lasers 12 electrically connected to laser terminals 234E, 234F, 234G, 234H. Further, since the number of current paths at the external connection part can be reduced, a size of a connector connected to the external connection part can be reduced. Moreover, since a conducting wire width dimension of detour path 236 can be reduced, a protrusion amount of protrusion 250 for forming detour path 236 can be reduced.

Third Exemplary Embodiment

Next, a projection-image display apparatus according to a third exemplary embodiment will be described. The projection-image display apparatus in the present exemplary embodiment has the same configuration as the projection-image display apparatus described in the first exemplary embodiment, and a configuration of a light source device is different. In the present exemplary embodiment, differences in the configuration of the light source device from the first exemplary embodiment will be mainly described.

[3-1. Configuration of Light Source Device]

Since an insulator, a light-source holding body, and a heat sink in the light source device of the present exemplary embodiment have the same configuration as those in the light source device described in the first exemplary embodiment, description of the insulator, the light-source holding body, and the heat sink is omitted.

Figure 15:
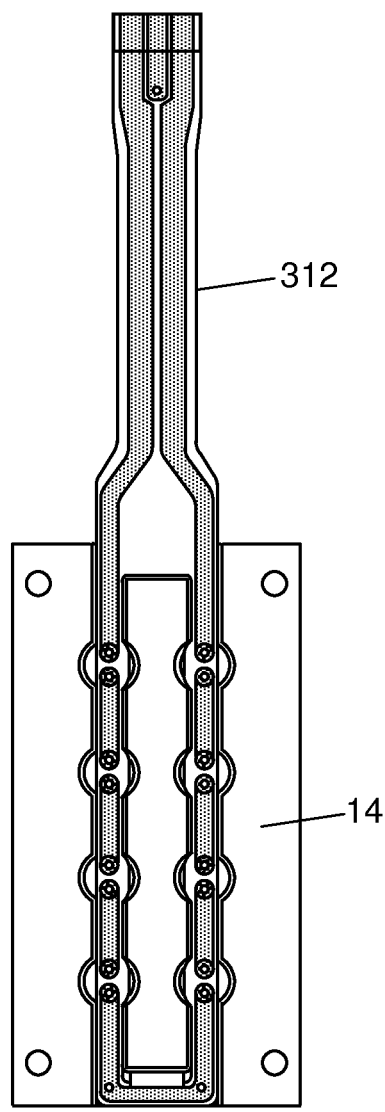
FIG. 15 is a rear view of a light source device according to a third exemplary embodiment in a state in which semiconductor lasers, an insulator, and an FPC are installed on a light-source holding body.

FIG. 15 is a rear view of the light source device according to the present exemplary embodiment in a state in which semiconductor lasers, the insulator, and an FPC are installed on the light-source holding body. In FIG. 15, eight semiconductor lasers 12, insulator 116, and FPC 312 are installed on light-source holding body 14.

[3-2. Configuration of FPC]

Figure 16A:
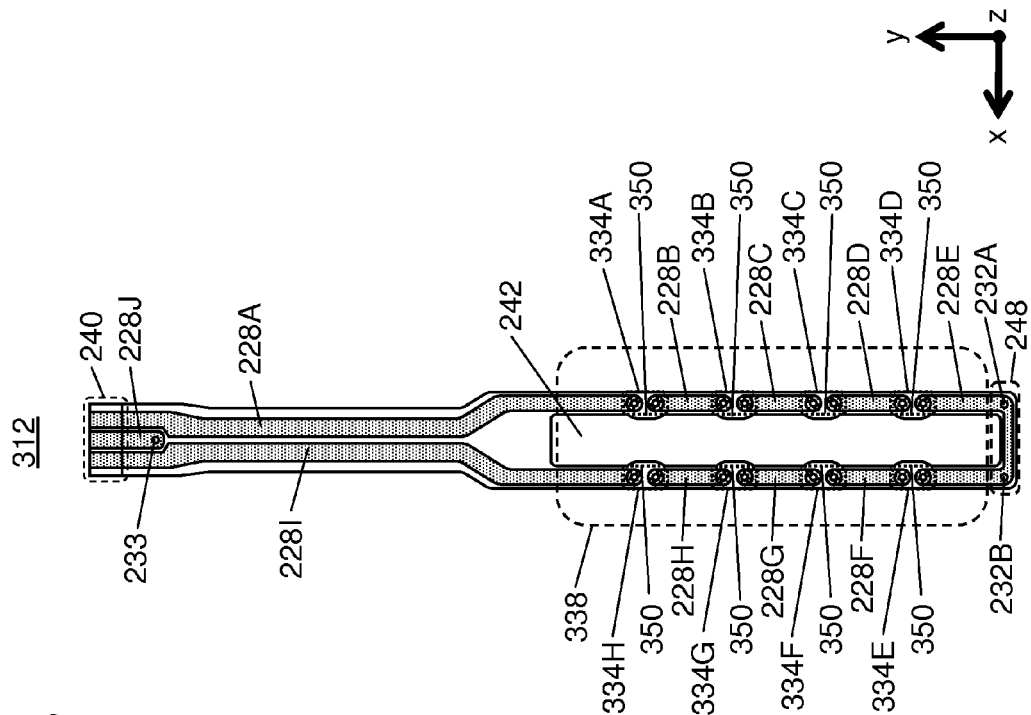
FIG. 16A is a front view of the FPC according to the third exemplary embodiment.

Next, details of FPC 312 will be described. In FPC 312 of the present exemplary embodiment, the same configuration as that in FPC 212 described in the second exemplary embodiment is denoted by the same numerical reference, and description of the same configuration may be omitted. FIG. 16A is a front view of FPC 312 in the present exemplary embodiment, and FIG. 16B is a rear view of FPC 312 in the present exemplary embodiment.

FPC 312 has a two-layer structure including conducting wires. In FIGS. 16A, 16B, FPC 312 has laser connection part 338 connected with eight semiconductor lasers 12, an external connection part 240, conducting wires 228A, 228B, 228C, 228D, 228E, 228F, 228G, 228H, 228I, 228J on a rear surface, and conducting wire 329 on a front surface. FPC 312 has opening 242 in the middle. At laser connection part 338, each four of eight semiconductor lasers 12 are disposed in line in a y-axis direction and are arranged parallel in two rows with opening 242 in between.

External connection part 240 is provided for connecting laser connection part 338 to an external power supply source, and parts of conducting wires 228A, 228I, 228J are arranged at external connection part 240.

Figure 16B:
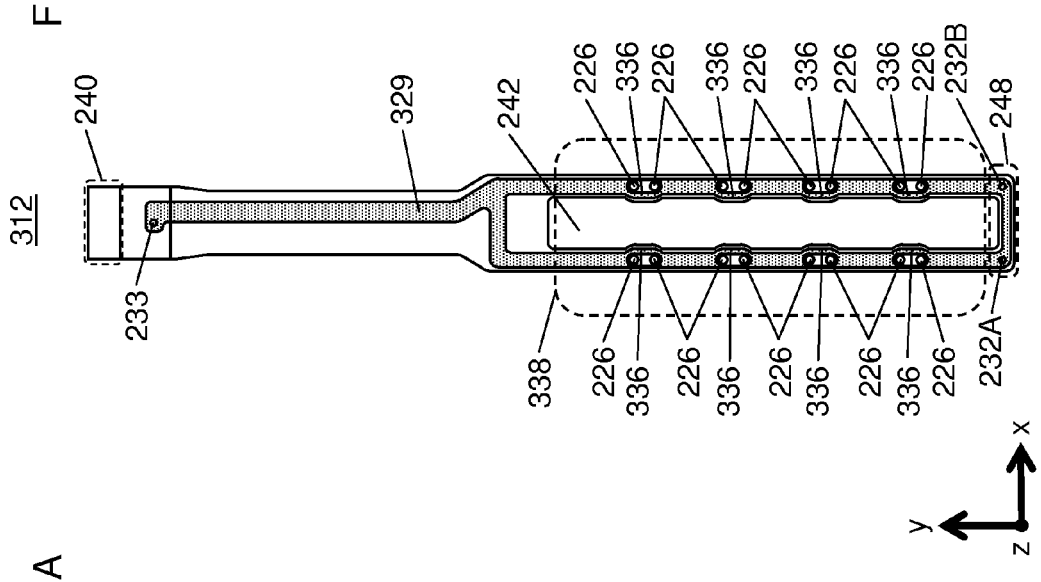
FIG. 16B is a rear view of the FPC according to the third exemplary embodiment.

As illustrated in FIGS. 16A, 16B, on the rear surface of FPC 312, laser terminals 334A, 334B, 334C, 334D and laser terminals 334E, 334F, 334G, 334H configuring laser connection part 338 are respectively formed in a row. Laser terminals 334A, 334B, 334C, 334D, 334E, 334F, 334G, 334H are respectively provided with two through-holes 226. A pair of lead wires 114 of one semiconductor laser 12 is arranged to penetrate through two through-holes 226 and electrically connected with FPC 312.

Conducting wire 228B electrically connecting between laser terminal 334A and laser terminal 334B is disposed, conducting wire 228C electrically connecting between laser terminal 334B and laser terminal 334C is disposed, conducting wire 228D electrically connecting between laser terminal 334C and laser terminal 334D is disposed, and conducting wire 228E electrically connecting between laser terminal 334D and laser terminal 334E is disposed. Conducting wire 228F electrically connecting between laser terminal 334E and laser terminal 334F is disposed, conducting wire 228G electrically connecting between laser terminal 334F and laser terminal 334G is disposed, and conducting wire 228H electrically connecting between laser terminal 334G and laser terminal 334H is disposed.

Bridge 248 is a part orthogonal to the respective conducting wires arranged at laser connection part 338. Conducting wires 228E and 329 are electrically connected by via holes 232A, 232B provided at bridge 248. Conducting wires 228A, 228B, 228C, 228D, 228E, 228F, 228G, 228H, 228I, 228J, 329 form a power supply circuit for supplying power to eight semiconductor lasers 12.

As illustrated in FIG. 16A, on the front surface of FPC 312, conducting wire 329 including eight detour paths 336 are disposed. Each detour path 336 detours at a certain distance from hole walls of through-holes 226 in positive and negative directions of an x-axis. Further, as illustrated in FIG. 16B, eight protrusions 350 each protruding elliptically only toward opening 242 side in the x-axis direction are formed in vicinities of detour paths 336.

As illustrated in FIG. 16A, detour path 336 is branched in positive and negative directions of the x-axis, and a width of detour path 336 on opening 242 side is wider than a width of detour path 336 on the opposite side. Accordingly, protrusion 350 is caused to protrude toward opening 242 side of detour path 336 and is not caused to protrude outward.

At laser connection part 338, conducting wire 329 is disposed at a position overlapping with conducting wires 228A, 228B, 228C, 228D, 228E, 228F, 228G, 228H, 228I, excluding detour paths 336, as viewed in a z-axis direction.

Conducting wire 329 is electrically connected with conducting wire 228J in the z-axis direction by via hole 233.

Further, switching circuit 211 described in the second exemplary embodiment is provided outside the light source device. Switching circuit 211 controls current paths to conducting wires 228A, 228J, 228I.

[3-3. Light-Emitting Operation of Semiconductor Lasers]

Next, light-emitting operation of semiconductor lasers 12 will be described. Switch 211a and switch 211b in switching circuit 211 are both turned off, and the current is set so as to flow into conducting wire 228A and flow out from conducting wire 228I.

The current flows into conducting wire 228A, and flows, via conducting wires 228B, 228C, 228D, in four semiconductor lasers 12 that are electrically connected to laser terminals 334A, 334B, 334C, 334D at laser connection part 338 on the rear surface of FPC 312. After that, the current flows to conducting wire 228E, then flows, via conducting wires 228F, 228G, 228H, in four semiconductor lasers 12 that are electrically connected to laser terminals 334E, 334F, 334G, 334H at laser connection part 338, and flows out from conducting wire 228I.

Further, by via holes 232A, 232B provided at bridge 248, when the current passes through conducting wire 228E, the current also flows to conducting wire 329 on the front surface of FPC 312 only between via hole 232A and via hole 232B.

In a case where any one of semiconductor lasers 12 electrically connected to laser terminals 334A, 334B, 334C, 334D at laser connection part 338 on the rear surface of FPC 312 fails in an open-mode, only conducting wire 229 is replaced with conducting wire 329 in the current circuit described in the second exemplary embodiment, and substantially the same current paths are formed. Further, in a case where any one of semiconductor lasers 12 electrically connected to laser terminals 334E, 334F, 334G, 334H at laser connection part 338 on the rear surface of FPC 312 fails in an open-mode, only conducting wire 229 is replaced with conducting wire 329 in the current circuit described in the second exemplary embodiment, and substantially the same current paths are formed.

Since conducting wires 329 at laser connection part 338 have a symmetrical shape, electric resistance in each conducting wire of conducting wire 329 at that part is equal. Therefore, in a case where semiconductor laser 12 fails in the open-mode, about the same amount of current, i.e., a half of an amount of current flowing at laser connection part 338 on the rear surface of FPC 312, flows in each conducting wire of conducting wire 329 arranged at laser connection part 338 on the front surface of FPC 312.

Further, since respective conducting wires arranged in one detour path 336 have different widths, amounts of current flowing in the respective conducting wires are different. In the present exemplary embodiment, in order to prevent damage of the substrate due to Joule heating, a total of cross-sectional areas of both the conducting wires is designed to be a half of that of a conducting wire of laser connection part 338 on the rear surface of FPC 312. And, in the same way as the second exemplary embodiment, a conducting wire width of conducting wire 329 at laser connection part 338 on the front surface of FPC 312 excluding detour paths 336 is designed to have the same dimension as a conducting wire width on the rear surface of FPC 312 at that part.

In the present exemplary embodiment, it is described that the detour path is branched. However, an unbranched wiring pattern without the smaller conducting wire may be provided.

[3-4. Effects Etc.]

As described above, in FPC 312, since protrusions 350 do not protrude outward, an external size of FPC 312 can be made smaller, and a member cost of FPC 312 can be reduced.

Figure 17:
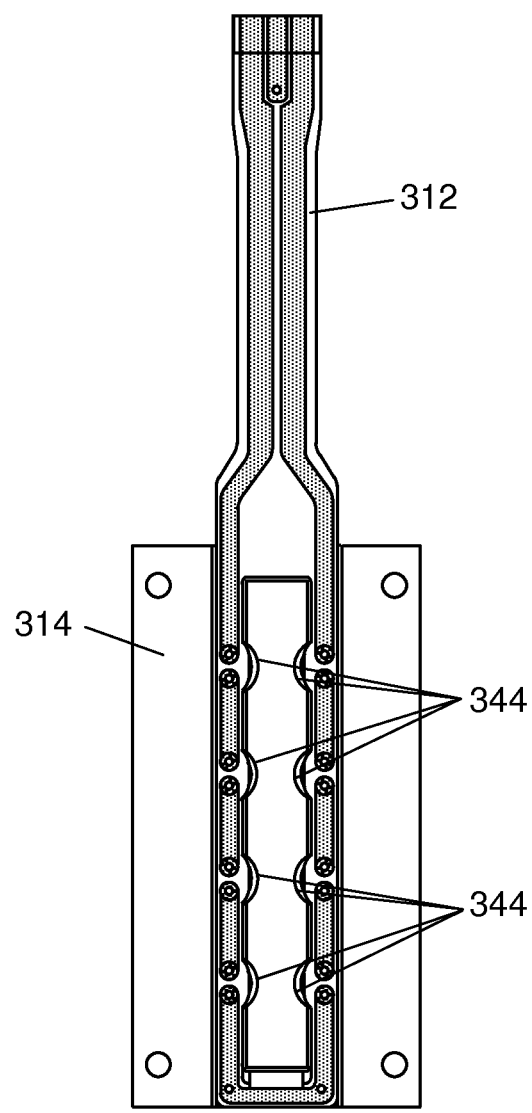
FIG. 17 is a rear view of the light source device according to the third exemplary embodiment in a state in which the semiconductor lasers, another insulator, and the FPC are installed on another light-source holding body.

It is described that the light-source holding body in the present exemplary embodiment has the same shape as the light-source holding body in the first and second exemplary embodiments. However, the present disclosure is not limited to this. FIG. 17 is a rear view of the light source device according to the present exemplary embodiment in a state in which the semiconductor lasers, another insulator, and the FPC are installed on another light-source holding body. In FIG. 17, eight semiconductor lasers 12, the insulator, and FPC 312 are installed on light-source holding body 314.

In FIG. 17, in light-source holding body 314, a shape of recess 344 is substantially similar to an outer shape of FPC 312 to be installed. In order to receive protrusion 350, recess 344 is formed at eight portions in a substantially semicircular shape only in an inward direction, and is not formed in an outward direction.

In the configuration in FIG. 17, a contact area between light-source holding body 314 and heat sink 16 can be increased, and heat generated by semiconductor lasers 12 can be efficiently cooled.

Other Exemplary Embodiments

The present disclosure is not limited to the aforementioned exemplary embodiments and is applicable to exemplary embodiments where modifications, replacements, additions, omissions, or the like are performed.

In the aforementioned exemplary embodiments, it is described that the projection-image display apparatus using three DMDs is employed. However, a projection-image display apparatus using one DMD or a projection-image display apparatus using a liquid crystal panel may be employed.

The configuration of the light source part described in the aforementioned exemplary embodiments is one example, and the present disclosure is not limited to this. The characteristics of the dichroic mirror are not limited either.

The wavelength and the polarization characteristics of the semiconductor laser described in the aforementioned exemplary embodiments is one example, and the present disclosure is not limited to this.

In the aforementioned exemplary embodiments, it is described that the FPC has the two-layer structure including the conducting wires. However, the present disclosure is not limited to this. In the FPC having three or more layers of the conducting wires, a configuration of any two of those layers may be used as the configuration of the present disclosure. Further, in the FPC having three or more layers of the conducting wires, a wiring forming detour paths may be branched into the other layers.

In the aforementioned exemplary embodiments, it is described that the semiconductor laser is used. However, the present disclosure is not limited to this. A solid light source, such as a light emitting diode, may be employed.

The current path described in the aforementioned exemplary embodiments is one example, and the present disclosure is not limited to this.

What is claimed is:

1. A light source device comprising:
a first light source including at least two light sources;
a second light source including at least two light sources; and
a substrate for supplying power to the first light source and the second light source,
wherein the substrate has a multilayer structure including a base member, and a first wiring is disposed on a first layer of the substrate and a second wiring is disposed on a second layer of the substrate,
the first wiring and the second wiring are electrically connected,
the first wiring has a first connection part including at least two connection parts such that the first light source is electrically connected in series and a second connection part including at least two connection parts such that the second light source is electrically connected in series,
the base member is provided with at least one through-hole at each of portions where the connection parts of the first connection part and the second connection part are disposed,
the base member includes at least one protrusion in a vicinity of the through-hole such that the protrusion protrudes along a surface of the base member in a direction intersecting the first wiring, and
the second wiring includes at least one detour path in a vicinity of the protrusion, detouring around the through-hole with an insulation distance from the through-hole.

2. The light source device according to claim 1, wherein the protrusion of the base member is formed to protrude in an inward direction of the substrate.

3. The light source device according to claim 1, further comprising a light-source holding body for holding the first light source and the second light source,
wherein a recess for receiving part of the substrate is formed on a first surface of the light-source holding body, and the recess is further formed with at least one receiving portion for receiving the protrusion of the base member of the substrate.

4. The light source device according to claim 3, further comprising a heat dissipation member for dissipating heat from the first light source and the second light source,
wherein the heat dissipation member is thermally connected with the first surface of the light-source holding body.

5. A projection-image display apparatus comprising:
the light source device according to claim 1;
an image generator for generating image light according to image input signals;
a light guide optical system for guiding light from the light source device to the image generator;
a projection optical system for projecting the image light; and
a controller for controlling the light source device and the image generator.

* * * * *